United States Patent [19]
Sawada

[11] Patent Number: 6,093,591
[45] Date of Patent: Jul. 25, 2000

[54] METHOD OF FABRICATING A SEMICONDUCTOR INTEGRATED CIRCUIT DEVICE

[75] Inventor: Shigeki Sawada, Kyoto, Japan

[73] Assignee: Matsushita Electronics Corporation, Osaka, Japan

[21] Appl. No.: 09/056,209

[22] Filed: Apr. 7, 1998

[30] Foreign Application Priority Data

Apr. 8, 1997 [JP] Japan .................................. 9-089132

[51] Int. Cl.$^7$ ............................................. H01L 21/762
[52] U.S. Cl. ........................ 438/207; 438/433; 438/450
[58] Field of Search .................... 438/207, 433, 438/450, FOR 229, FOR 207

[56] References Cited

U.S. PATENT DOCUMENTS

| | | |
|---|---|---|
| 4,536,945 | 8/1985 | Gray et al. . |
| 4,797,372 | 1/1989 | Verret et al. . |
| 5,134,082 | 7/1992 | Kirchgessner . |
| 5,405,790 | 4/1995 | Rahim et al. . |
| 5,439,833 | 8/1995 | Hebert et al. . |
| 5,506,156 | 4/1996 | Watanabe et al. . |
| 5,693,555 | 12/1997 | Kim et al. . |
| 5,960,272 | 9/1999 | Ishimaru . |

FOREIGN PATENT DOCUMENTS

| | | |
|---|---|---|
| 0 232 497 | 8/1987 | European Pat. Off. . |
| 1-192131 | 8/1989 | Japan . |
| 3-262154 | 11/1991 | Japan . |
| 7-335741 | 12/1995 | Japan . |

*Primary Examiner*—George Fourson
*Attorney, Agent, or Firm*—Pearne & Gordon LLP

[57] ABSTRACT

In a Bi-CMOS integrated circuit device, to reduce a collector-substrate junction capacitance in an NPN transistor and to reduce the step of forming an anti-punch-through layer of the N-channel MOS transistor. Using as a mask a resist pattern having windows made on an element isolation LOCOS film 113a, 113c and P-type well layer 106, impurities are ion-implanted to form a channel stopper layer 115a, 115b for element isolation of a NPN transistor and an anti-punch-through layer 115c for a N-channel MOS transistor. Thus, a sufficient element isolation withstand voltage can be assured while avoiding an increase in the collector-substrate capacitance of the NPN transistor which is due to the transverse diffusion of the channel stopper layer when an epitaxial layer, well layer and LOCOS film are formed. In addition, without increasing the number of steps, the drain-source withstand voltage of the N-channel type MOS transistor and the short channel durability can be improved.

16 Claims, 15 Drawing Sheets

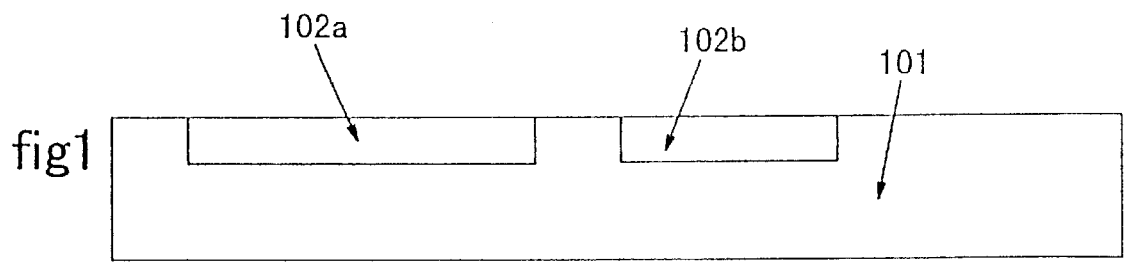
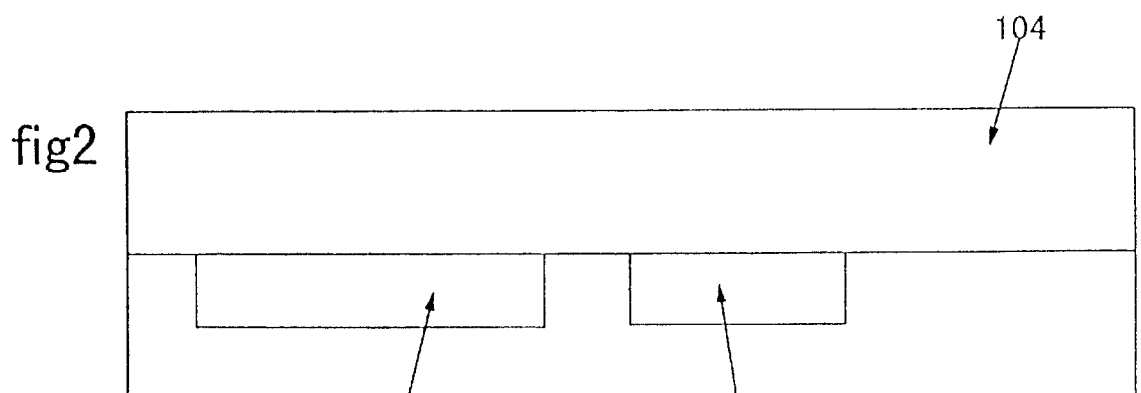
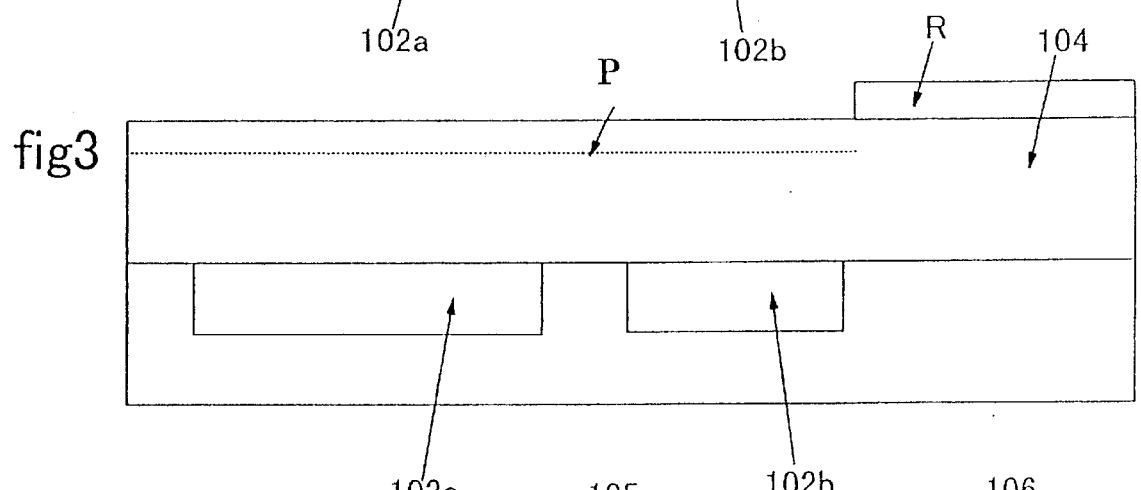
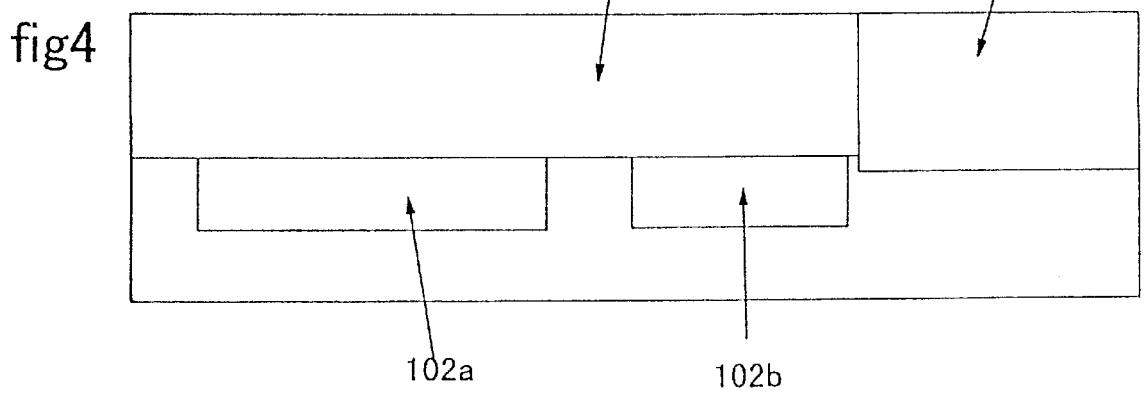

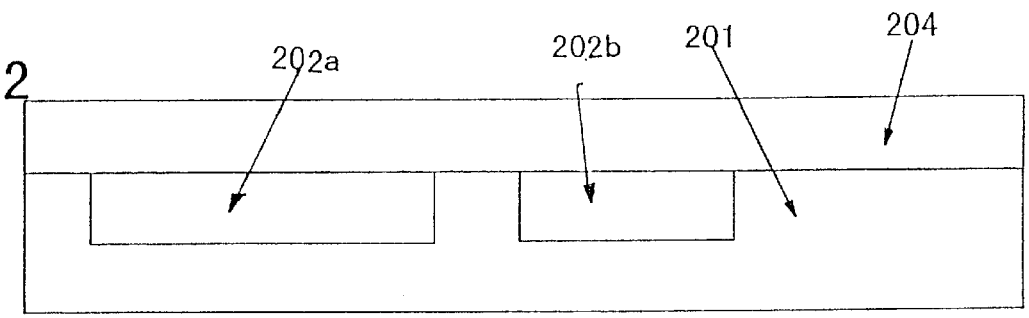
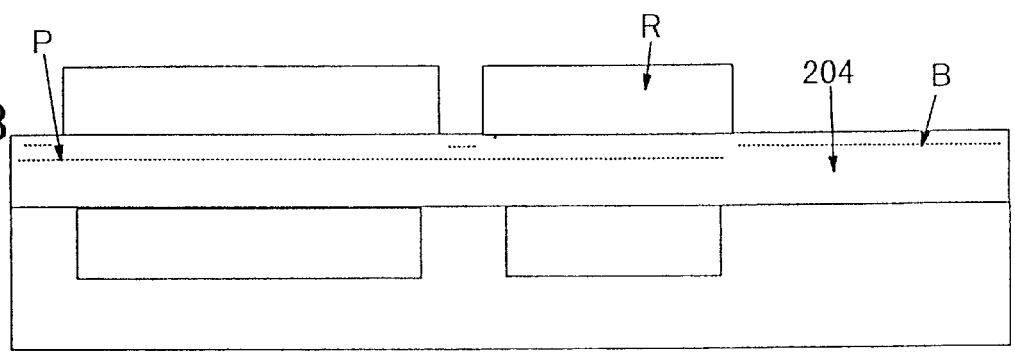
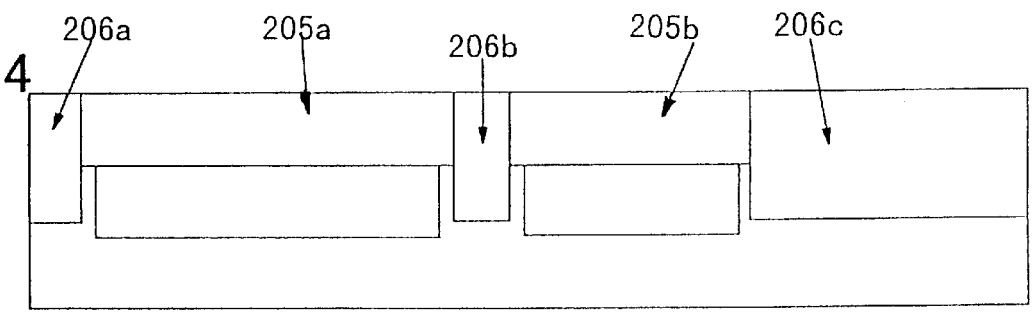
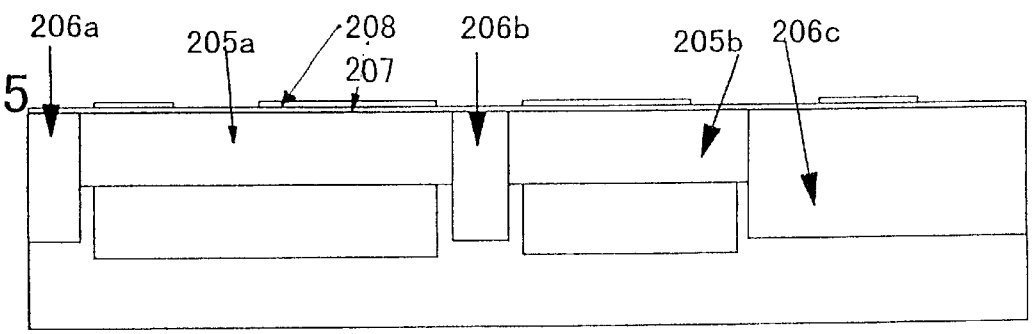

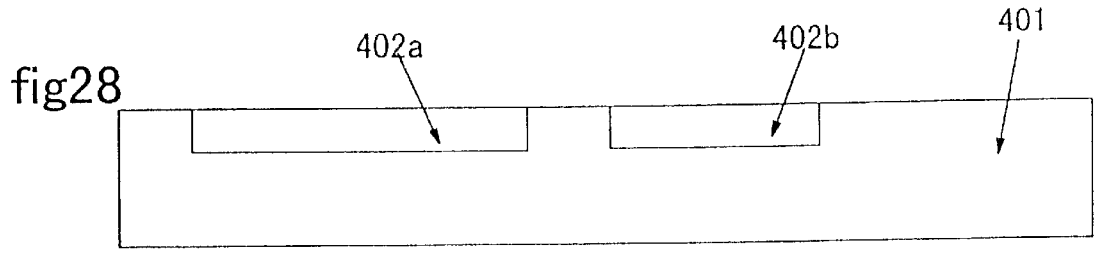
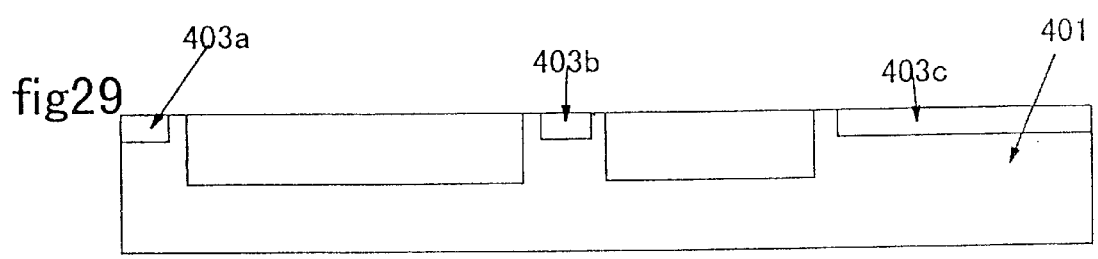
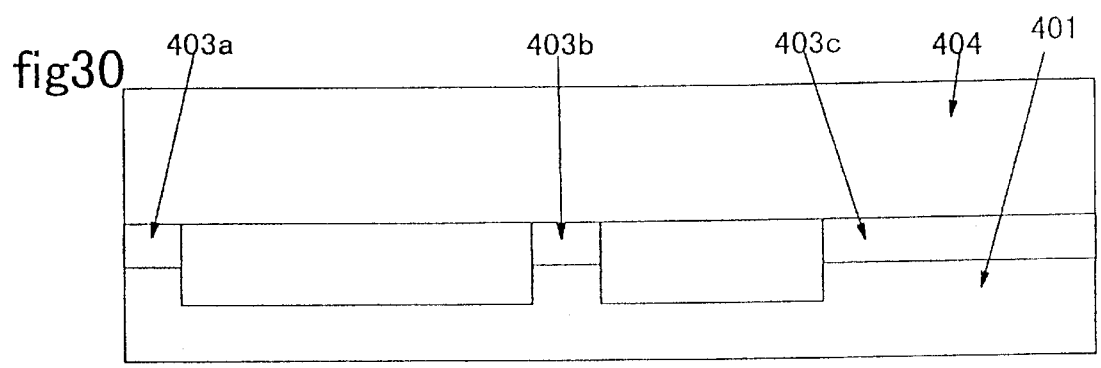
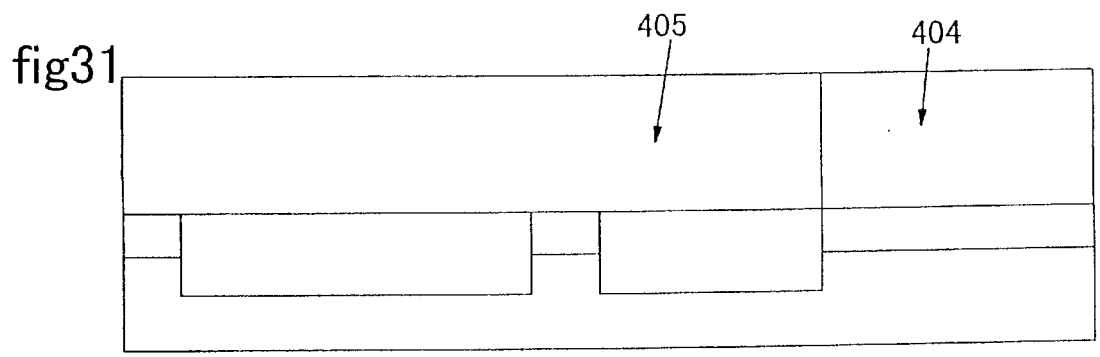

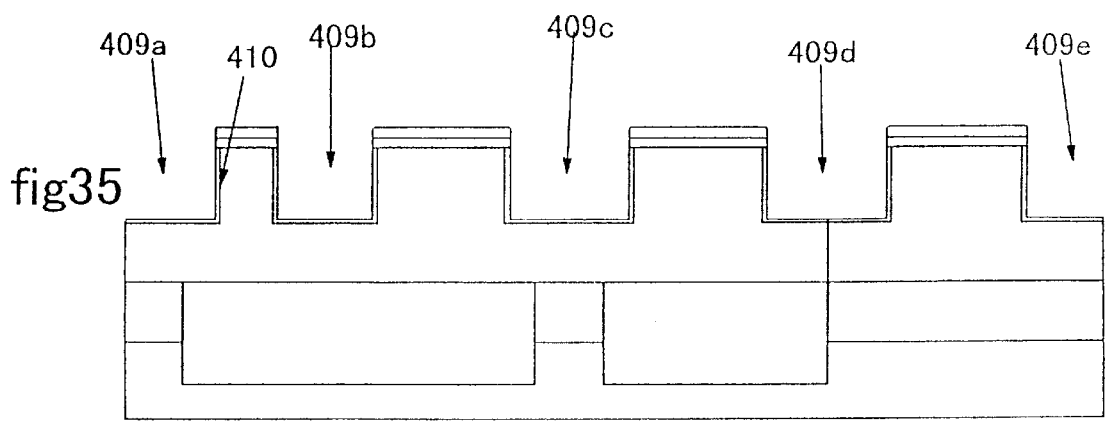
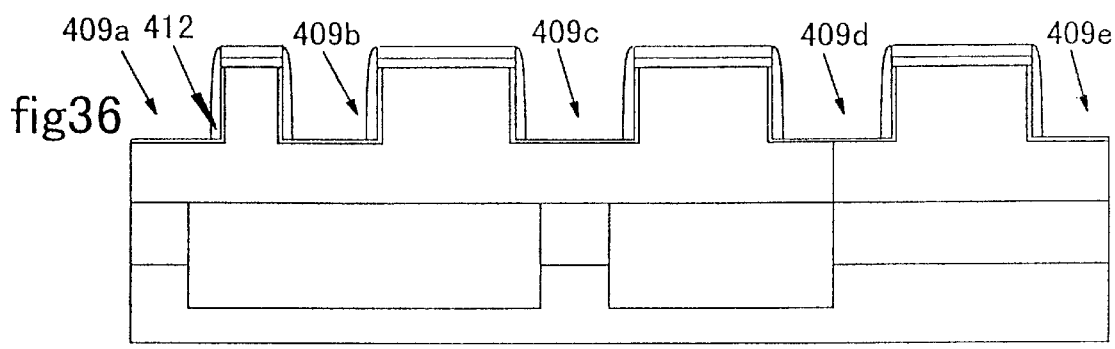

6,093,591

METHOD OF FABRICATING A SEMICONDUCTOR INTEGRATED CIRCUIT DEVICE

BACKGROUND OF THE INVENTION

1. Field of the Invention

The present invention relates to a method of fabricating a semiconductor integrated circuit device, particularly, that in which a bipolar transistor and a CMOS transistor are formed on the same semiconductor substrate.

2. Description of the Related Art

Conventionally, where a Bi-CMOS semiconductor integrated circuit in which a bipolar transistor and a CMOS transistor are integrated on the same substrate is manufactured, as described in e.g. JP-A-3-262154, the steps of forming the bipolar transistor and CMOS transistor are commonized to reduce the number of fabricating steps.

Referring to step sectional views shown in FIGS. 28–48, an explanation will be given of the above conventional technique.

First, as shown in FIG. 28, using a resist pattern formed by photolithography (hereinafter, also referred to simply "resist pattern" or "resist") as a mask, ions of arsenic (As) or antimony (Sb) are implanted into a surface of a P-type silicon (Si) substrate 401. The resist pattern is removed by plasma ashing using oxygen gas (hereinafter referred to "oxygen plasma ashing") Thereafter, the substrate is heat-treated to form an N-type embedded collector layer 402a for a bipolar transistor and an N-type embedded well layer 402b for a P-channel MOS transistor.

As shown in FIG. 29, using a resist pattern as a mask, ions of boron (B) are implanted into the surface of the P-type Si substrate 401. This resist pattern is removed by oxygen plasma ashing. The Si substrate 401 is heat-treated to form P-type channel stopper layers 403a, 403b for the bipolar NPN transistor and P-type embedded well layer 403c for an N-channel MOS transistor.

As shown in FIG. 30, on the surface of the P-type Si substrate 401, an N-type epitaxial layer 404 doped with impurities of arsenic (As) or phosphorus (P) is grown at a temperature range of 1100–1200° C.

As shown in FIG. 31, using a resist pattern as a mask, ions of phosphorus (P) are implanted into the surface of the N-type epitaxial layer 404. After the resist pattern is removed by oxygen plasma ashing, the Si substrate 401 is heat-treated at a temperature of about 1100° C. to form a collector layer of the bipolar NPN transistor and an N-type well layer 405 serving as a well of the P-channel MOS transistor.

As shown in FIG. 32, using a resist pattern as a mask, ions of boron are implanted into the surface of the N-type epitaxial layer 404. After the resist pattern is removed, the Si substrate 401 is heat-treated to form a P-type well layer 406 serving as a well of the N-channel MOS transistor.

As shown in FIG. 33, on the surface of the N-type epitaxial layer 404 in which P-type well layer 406 and N-type well layer 405 are formed (hereinafter, also referred to simply "N-type epitaxial layer 404"), a silicon oxide film 407 is formed by thermal oxidation and a silicon nitride film 408 is formed by reduced-pressure CVD.

As shown in FIG. 34, using a resist pattern as a mask on the silicon nitride film 408, the silicon nitride film 408, oxide film 407 and N-type epitaxial layer 404 are successively etched to form silicon trenches 409a–409e. And then the resist pattern is removed by oxygen plasma ashing.

As shown in FIG. 35, by thermal oxidation, oxide film 410 is formed on the bottom and side wall of each of the silicon trenches 409a–409e.

As shown in FIG. 36, the above silicon nitride film is anisotropically etched to form a side wall silicon nitride film 412 on the respective side walls of the silicon trenches 409a–409e.

As shown in FIG. 37, using the silicon nitride film 408 and the silicon nitride film 412 formed on the side wall of the trenches 409a–409e as a mask, the silicon trenches 409a–409e are thermally oxidized in a temperature range of 1000–1100° C. to form element isolation LOCOS films 413a–413e which reach the P-type silicon substrate 401. Thereby the N-type well layer 405 is separated to plurality of N-type well layer 405a–405e.

The silicon nitride film 408 and 412 are removed using phosphoric acid solution, and thereafter the oxide films 407a–407d are removed using a mixed solution of ammonium fluoride ($NH_4F$) and hydrofluoric acid (HF).

As shown in FIG. 38, using a resist pattern formed on the N-type epitaxial layer 404 as a mask, ions of phosphorus (P) are implanted to form an anti-punch-through layer 414 for the P-channel MOS transistor in the N-type well layer 405c of the P-channel MOS transistor. Ions of boron (B) are ion-implanted to introduce impurities 416 for controlling the threshold voltage of the P channel MOS transistor. Thereafter, the resist pattern is removed by oxygen plasma ashing.

As shown in FIG. 39, using a resist pattern formed on the N-type epitaxial layer 404 as a mask, ions of boron (B) are implanted to form an anti-punch-through layer 415 for the N-channel MOS transistor in the P-type well layer 406 of the P-channel MOS transistor. Ions of boron (B) are ion-implanted to introduce impurities 417 for controlling the threshold voltage of the N-channel MOS transistor. Thereafter, the resist pattern is removed by oxygen plasma ashing.

As shown in FIG. 40, using a resist pattern as a mask, ions of boron (B) are selectively implanted into the surface of the N-type epitaxial layer 404. After the resist pattern is removed, the Si-substrate is heat-treated to form a base layer 418 of the NPN bipolar transistor in the N-type well layer 405b as a collector layer of the NPN bipolar transistor.

As shown in FIG. 41, by thermal oxidation, gate oxide film 419 is formed on the N-type epitaxial layer 404. Thereafter, on the N-type epitaxial layer 404, using a resist pattern as a mask and a mixed solution of ammonium fluoride ($NH_4F$) and hydrofluoric acid (HF), the gate oxide film on emitter region of the NPN bipolar transistor is selectively removed to form an emitter electrode extracting opening 420. The resist pattern is removed by oxygen plasma ashing.

As shown in FIG. 42, on the entire surface of the N-type epitaxial layer 404, apolycrystalline silicon (Si) film is formed by reduced pressure CVD, and arsenic (As) or phosphorus (P) is ion-implanted to introduce impurities in the polycrystalline silicon film. After a CVD film is grown on the entire surface, using a resist pattern as a mask, the CVD oxide film and polycrystalline silicon (Si) film are etched by anisotropic dry etching to form a emitter electrode 421, an oxide film thereon 423, a gate electrode 422a, 422b and an oxide film 423b, 423c thereon. The resist pattern is removed by oxygen plasma ashing.

As shown in FIG. 43, using as a mask a resist pattern and gate electrode 422a of the P-channel MOS transistor and oxide film 423b thereon, boron (B) is ion-implanted to a LLD layer 424 of the P-channel MOS transistor. Therefore, the resist pattern is removed by oxygen plasma ashing.

As shown in FIG. 44, using as a mask a resist pattern and gate electrode 422b of the N-channel MOS transistor and oxide film 423c thereon, phosphorus (P) is ion-implanted to form a LLD layer 425 of the N-channel MOS transistor. Therefore, the resist attern is removed by oxygen plasma ashing.

Finally, as shown in FIG. 45, the CVD oxide film formed on the entire surface are anisotropically etched to form side wall oxide films 426 on the side walls of the emitter electrode 421 and gate electrodes 422a and 422b.

As shown in FIG. 46, using as a mask a resist pattern, the oxide film 423a on the emitter electrode 421 and the oxide film 423b on the gate electrodes and side wall oxide film 426 on the side walls, boron is ion-implanted to form an external base layer 427 of the NPN transistor and a source/drain layer 428 of the P-channel MOS transistor. The resist pattern is removed by oxygen plasma ashing.

As shown in FIG. 47, using as a mask a resist pattern, the oxide film 423c on the gate electrode 422b and side wall oxide film 426 on the corresponding side wall, boron is ion-implanted to form a corrector contact layer 430 of the NPN transistor and a source/drain layer 429 of the N-channel MOS transistor. The resist pattern is removed by oxygen plasma ashing.

As shown in FIG. 48, heat treatment is carried out in an atmosphere of nitrogen at a temperature so that arsenic (As) in the emitter electrode 421 of the NPN bipolar transistor is diffused into the base layer 418 through the opening 420 for extending the emitter electrode thereby to form the emitter layer 431.

As described above, Bi-CMOS semiconductor integrated circuit is fabricated, and in the above described technique, the step of forming the N-type embedded collector 402a of the bipolar transistor and N-type embedded well layer 402b of the P-channel MOS transistor; the step of forming the P-type embedded channel stopper layer 403a, 403b of the bipolar transistor and P-type embedded well layer 403c of the N-channel MOS transistor; the step of forming the collector layer of the bipolar transistor and well layer of the P-channel MOS transistor; the step of forming the emitter electrode 421 and gate electrode 422a, 422b; the step of forming the external base layer 427 of the bipolar transistor and source/drain layer 428 of the P-channel MOS transistor, are performed by a same step respectively. In this way, the number of fabricating steps could be reduced.

When miniaturization of a Bi-CMOS integrated circuit is intended for high integration, high speed and low power consumption, miniaturization of an element isolation region is important. In the conventional method of fabricating a semiconductor device, by impurity diffusing transversally in the following heat treatment step, embedded channel stopper layer below a element isolation film forms a junction with the embedded collector layer with a high impurity concentration so that the junction capacitance between the collector and substrate of the NPN transistor is increased. That is to say, the P-type embedded channel stopper layers 403a, 403b immediately below the element isolation LOCOS films 413a and 413c reaching the P-type Si substrate 401 of the bipolar transistor are diffused transversely in parallel to the surface of the Si substrate 401 by heat treatment at a high temperature over about 1100° C., for e.g. growing the epitaxial layer 404 after the embedded channel stopper has been formed, for forming the N-type well 405 and P-type well 406 and for forming the element isolation LOCOS films 413a–413e.

This forms a junction with the N-type embedded collector layer 402a with a high impurity concentration so that the junction capacitance between the collector and substrate of the NPN transistor is increased and the high frequency characteristic of the NPN transistor is lowered. Further, the presence of the anti-punch-through layer 415 of the N-channel MOS transistor by ion implantation by boron increases the number of steps leading to cost enhancement.

SUMMARY OF THE INVENTION

The present invention intends to reduce the junction capacitance between the collector and substrate of an NPN transistor and obtain a good radio frequency characteristic.

Another object of the present invention is to reduce the step of forming an anti-punch-through layer of an N-channel MOS transistor.

In order to solve the above problem, the method of fabricating a semiconductor integrated circuit device according to the present invention comprises the steps of:

on a semiconductor substrate having a first conductivity type, forming a semiconductor layer having a second conductivity type opposite to conductivity type of the semiconductor substrate;

forming an element isolation diffused layer having the first conductivity to reach a semiconductor substrate;

forming an insulating film on the surface of the element isolation diffused layer; and simultaneously introducing impurities having the first conductivity type into said element isolation diffused layer and said first impurity diffused layer by ion implantation to form a second impurity diffused layer having the first conductivity type which abuts on a bottom of said field insulating film, and a third impurity diffused layer having the first conductivity type in said first impurity diffused layer.

Namely, the method of fabricating a semiconductor integrated circuit device according to the present invention comprises the step of forming a mask film having windows on an isolation insulating film and a first impurity diffused layer which reaches a semiconductor substrate from the surface of a semiconductor layer the semiconductor substrate in a region where an element is to be formed; and simultaneously introducing impurities into the semiconductor substrate in an element isolation region and the first impurity diffused layer through the windows of the mask film by ion implantation the step of forming a second impurity diffused layer which abuts on the bottom of the element isolation film and a third impurity diffused layer in the first impurity diffused layer.

A first aspect of the method is a method of fabricating a semiconductor integrated circuit device of a present invention, which comprises the steps of:

on a semiconductor substrate having a first conductivity type, forming a semiconductor layer having a second conductivity type opposite to conductivity type of the semiconductor substrate;

forming an element isolation insulating film to reach said semiconductor substrate;

; and introducing impurities of the first conductivity type into said semiconductor substrate through the element isolation insulating film by ion implantation to form an impurity diffused layer having the first conductivity type which abuts on a bottom of said element isolation insulating film.

A second aspect of the method is a method according to the first aspect, wherein the introducing step comprises the steps of:

forming a mask film having a prescribed window on said element isolation insulating film; and introducing impurities of the first conductivity type into said semiconductor substrate through the window of said mask by ion implantation to form an impurity diffused layer having the first conductivity type which abuts on a bottom of said element isolation insulating film. The first and second aspects, is able to suppresses the transverse extension of diffusion of the impurity diffused layer formed to abut on the bottom of the element isolation, which is attributable to heat treatment when the semiconductor layer and element isolation film are formed.

A third aspect of the method is a method of fabricating a semiconductor integrated circuit device, which comprises the steps of:

on a semiconductor substrate having a first conductivity type, forming a semiconductor layer having a second conductivity type opposite to conductivity type of the semiconductor substrate;

forming an element isolation diffused layer having the first conductivity to reach said semiconductor substrate;

forming an insulating film on the surface of the element isolation diffused layer; and introducing impurities having the first conductivity type into said element isolation diffused layer through the insulating film by ion implantation to form an impurity diffused layer as a channel stopper, having the first conductivity type which abuts on a bottom of said insulating film.

A fourth aspect of the method is a method according to the third aspect, where in the introducing step comprises the steps of:

forming a mask film having a prescribed window on said isolation insulating film; and introducing impurities having the first conductivity type into said element isolation diffused layer through the window of said mask by ion implantation to form an impurity diffused layer having the first conductivity type which abuts on a bottom of said isolation insulating film.

The third and fourth aspect suppresses the transverse extension of diffusion of the impurity diffused layer formed to abut on the bottom of the isolation insulating film, which is attributable to heat treatment when the semiconductor layer, isolation insulating film and element isolation film are formed.

A fifth aspect of the method is a method of fabricating a semiconductor integrated circuit device, which comprises the steps of:

on a semiconductor substrate having a first conductivity type, forming a semiconductor layer having a second conductivity type opposite to conductivity type of the semiconductor substrate;

forming a first diffused layer having the first conductivity on the semiconductor layer corresponding to the region where an element is to be formed so as to reach the semiconductor substrate;

forming an element isolation insulating film to reach said semiconductor substrate from a surface of the semiconductor layer;

introducing impurities of the first conductivity type into said semiconductor substrate through the element isolation insulating film into the semiconductor substrate through the element isolation insulating film and into the first diffused layer corresponding to the region where an element is to be formed by ion implantation to form a second impurity diffused layer having the first conductivity type which abuts on a bottom of said element isolation insulating film and a third impurity diffused layer having the first conductivity type in the first diffused layer.

A sixth aspect of the method is method according to the fifth aspect, wherein the introducing step comprises the steps of:

forming a mask film having a prescribed windows on said element isolation insulating film and on said semiconductor layer corresponding to the said region where an element is to be formed, and simultaneously introducing impurities having the first conductivity type into said semiconductor substrate corresponding to the element isolation region and the first impurity diffused layer through the windows of the mask by ion implantation to form the second impurity diffused layer having the first conductivity type which abuts on the bottom of said element isolation insulating film, and the third impurity diffused layer having the first conductivity type in said first impurity diffused layer.

The fifth and sixth aspects suppresse the transverse extension of diffusion of the second impurity diffused layer formed to abut on the bottom of the element isolation insulating film, which is attributable to heat treatment when the semiconductor layer, first impurity diffused layer and element isolation film are formed.

This also make it possible to form, by the same step, the second

A seventh aspect of the method is a method of fabricating a semiconductor integrated circuit device, which comprises the steps of:

on a semiconductor substrate having a first conductivity type, forming a semiconductor layer having a second conductivity type opposite to conductivity type of the semiconductor substrate;

forming an element isolation diffused layer having the first conductivity to reach a semiconductor substrate;

forming an insulating film on the surface of the element isolation diffused layer; and simultaneously introducing impurities having the first conductivity type into said element isolation diffused layer and said first impurity diffused layer by ion implantation to form a second impurity diffused layer having the first conductivity type which abuts on a bottom of said isolation insulating film, and a third impurity diffused layer having the first conductivity type in said first impurity diffused layer.

An eighth aspect of the method is method according to the seventh aspect, wherein the introducing step comprises the steps of:

forming a mask film having prescribed windows on said isolation insulating film and on said semiconductor layer corresponding to the said region where an element is to be formed, and simultaneously introducing impurities having the first conductivity type into said element isolation diffused layer and said first impurity diffused layer through the windows of said mask by ion implantation to form a second impurity diffused layer having the first conductivity type which abuts on a bottom of said isolation insulating film, and a third impurity diffused layer having the first conductivity type in said first impurity diffused layer.

The seventh and eighth aspects suppress the transverse extension of diffusion of the second impurity diffused layer formed to abut on the bottom of the isolation insulating film, which is attributable to heat treatment when the semiconductor layer, element isolation diffused layer, first impurity diffused layer and element isolation film are formed. This also make it possible to form, by the same step, the second diffused layer which abuts on the bottom of the isolation insulating film and the third impurity diffused layer in the first impurity diffused layer.

A ninth aspect of the method is a method according to the first aspect, wherein the step of forming said element isolation insulating film comprises a step by thermal oxidation.

A tenth aspect of the method is a method according to the third aspect, wherein the step of forming said insulating film comprises a step by thermal oxidation.

An eleventh aspect of the method is method according to the fifth aspect, wherein the step of forming said element isolation insulating film comprises a step by thermal oxidation.

A twelfth aspect of the method is method according to the seventh aspect, wherein the step of forming said insulating film comprises a step by thermal oxidation.

A twelfth aspect of the method is method according to the third aspect, wherein the step of forming said isolation insulating film comprises a step by thermal oxidation. This suppresses the transverse extension of diffusion of the impurity diffused layer formed to abut on the bottom of the element isolation insulating film, which is attributable to heat treatment when the semiconductor layer and element isolation insulating film are formed. This also make it possible to form, by the same step, the second diffused layer which abuts on the bottom of the element isolation insulating film and the third impurity diffused layer in the first impurity diffused layer.

A thirteenth aspect of the method is method according to the seventh aspect, wherein said first impurity diffused layer is a P-type well layer constituting an N-channel type MIS transistor on its surface, and the introducing step comprises an ion implantation for introducing impurities, monovalent boron ions are implanted with an acceleration energy of 120 keV or more.

A fifteenth aspect of the method is method according to the seventh aspect, wherein said first impurity diffused layer is a P-type well layer constituting an N-channel type MIS transistor on its surface, and the introducing step comprises an ion implantation for introducing impurities, divalent boron ions are implanted with an acceleration energy of 60 keV or more.

A sixteenth aspect of the method is method according to the seventh aspect, wherein said first impurity diffused layer is a P-type well layer constituting an N-channel type MIS transistor on its surface, and the introducing step comprises an ion implantation for introducing impurities, trivalent boron ions are implanted with an acceleration energy of 40 keV or more.

According to the fourteenth aspect to sixteenth aspect, acceleration energy can be reduced. The aspects, in a method of fabricating a semiconductor device according to claim 3 or 4, is characterized in that the first impurity diffused layer is a P-type well layer constituting an N-channel type MIS transistor on its surface, and in the ion implantation for introducing impurities, monovalent boron ions, divalent boron ions or trivalent boron ions are implanted with an acceleration energy of 120 keV or more, 60 keV or more, or 40 keV or more, respectively. This suppresses the transverse extension of diffusion of the second impurity diffused layer, which is attributable to heat treatment when the semiconductor layer and element isolation insulating film are formed. This also make it possible to form, by the same step, the second impurity diffused layer and the third impurity diffused layer in the first impurity diffused layer.

BRIEF DESCRIPTION OF THE DRAWINGS

FIGS. 1 to 21 are a sectional views in a step sequence showing a method of fabricating a semiconductor integrated circuit device according to the first embodiment of the present invention.

FIGS. 22 to 27 are a sectional views in a step sequence showing a method of fabricating a semiconductor integrated circuit device according to the second embodiment of the present invention.

FIGS. 31 to 48 are a sectional views in a step sequence showing a conventional semiconductor integrated circuit device.

DESCRIPTION OF THE PREFERRED EMBODIMENT

Figure 5:
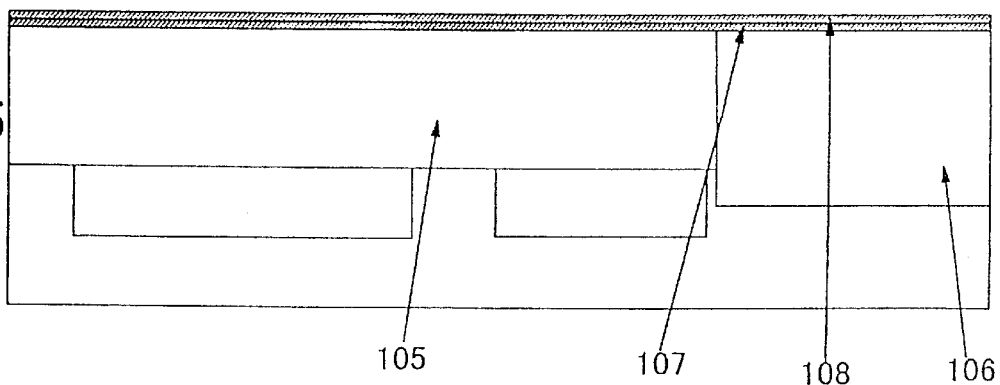

Now referring to FIGS. 1 to 21, an explanation will be given of a first embodiment of the present invention.

FIGS. 1 to 21 are step sectional views in a step sequence for explaining a method of fabricating a semiconductor device according to the first embodiment of the present invention. As shown in FIG. 21, the first embodiment shows that in FIG. 21, a Bi-CMOS semiconductor integrated circuit in which a bipolar transistor and a CMOS transistor (P channel MOS transistor and N channel MOS transistor) are integrated on a surface of a N-type epitaxial layer 104 formed on a P-type silicon substrate 101. The method characterized in that after forming a element isolation film, by ion implantation through the element isolation film channel stopper layer 115a, 115b and anti-punch through layer are formed at a same time. Namely, N-type embedded collector layer of an NPN bipolar transistor 102a and a N-type embedded well layer of a P-channel MOS transistor 102b are formed on the P-type Si substrate 101, then an epitaxial layer 104 is formed on the entire surface of the P-type Si substrate 101. And then element isolation film 113(113a–113e) is formed so as to reach the P-type silicon substrate 101 and then by ion implantation through the element isolation film 113, channel stopper layer 115a, 115b and anti-punch through layer are formed at a same time. Thereby by impurity diffusing transversally in the following heat treatment step such as a step of forming the N-type epitaxial layer 104, and a step of forming the element isolation film 113 and so on, is prevented and the number of steps is able to be reduced.

First, using as a mask a resist pattern having windows made by photolithography on regions where an NPN bipolar transistor and P-channel MOS transistor are to be formed, into the surface of a P-type Si substrate 101 having a resistivity of 10 Ω·cm and plane orientation of (100) doped with boron (B), ions of arsenic (As) or antimony (Sb) are implanted from the surface of the P-type Si substrate 101. The ion implantation is carried out with dosage of about $1 \times 10^{15} cm^{-2}$ and acceleration energy of 40–60 kev.

After the resist has been removed by oxygen plasma ashing, heat treatment is carried out for 15–30 minutes at a temperature range of 1150–1200° C. to form an N-type embedded layer 102a and N-type well layer 102b having a junction depth of 1–2 μm and sheet resistance of 50–150 Ω/□ as shown in FIG. 1.

As shown in FIG. 2, on the surface of the P-type Si semiconductor substrate 101, an N-type epitaxial layer 104 is formed which has a thickness of 0.6–1.0 μm and resistivity of 1–5 Ω·cm due to impurities of arsenic (As) or phosphorus (P). The N-type epitaxial layer 104 is formed at a temperature of 1050° C. and pressure of about 80×133.322 Pa using a mixed gas of dichloro silane and arsine.

As shown in FIG. 3, using as a mask the resist pattern R formed on the surface of the N-type epitaxial layer 104 and having windows made by photolithography on regions where the NPN bipolar transistor and P-channel MOS transistor are to be formed, ions of phosphorus (P) are implanted from the surface of the N-type epitaxial layer 104. The ion implantation is carried out with dosage of $1 \times 10^{13}$ and acceleration energy of 100 keV.

After the resist has been removed by oxygen plasma ashing, a window of resist is made by photolithography in the region where the N-channel MOS transistor is to be formed. Using as a mask the resist pattern thus made, boron (B) is ion-implanted. In this case, the ion-implantation is carried out with dosage of $1 \times 10^{13} - 2 \times 10^{13}$ cm$^{-2}$ and acceleration energy of about 20 keV. The resist is removed by oxygen plasma ashing, heat treatment is carried out in an atmosphere of nitrogen gas at a temperature of 1100° C. for 90–150 minutes.

Thus, the N-type well layer 105, having a depth of the diffused layer of 0.6–1.0 μm and a surface concentration of about $5 \times 10^{16}$ cm$^{-3}$, is formed which reaches the N-type embedded collector layer 102a of the NPN bipolar transistor and the N-type embedded well layer 102b of the P-channel MOS transistor. Further, at the same time, as shown in FIG. 4, the P-type well layer 106, having a depth of the diffused layer of 0.8–1.5 μm and a surface concentration of about $7 \times 10^{16}$ cm$^{-3}$, is formed which reaches the P-type Si substrate 101 of the N-channel MOS transistor.

After the oxide film 107 is formed by thermal oxidation in an oxygen atmosphere at a temperature of 1000° C. on the surface of the N-type epitaxial layer 104 in which P-type well layer 106 and N-type well layer 105 are formed (hereinafter, also referred to simply "N-type epitaxial layer 104"), as shown in FIG. 5, a silicon nitride film 108 is formed which is used as a mask for selective oxidation when the LOCOS film is created. The silicon nitride film 108 having a thickness of about 120 nm is formed by reduced pressure CVD using a mixed gas of dichloro silane and ammonia.

Figure 6:
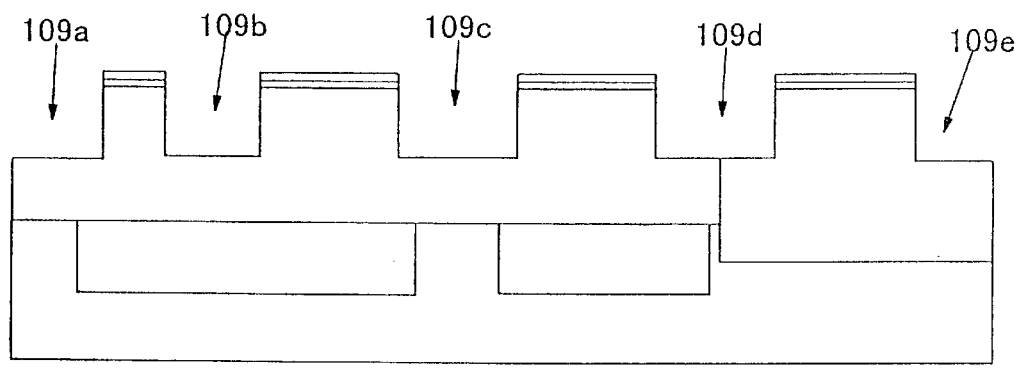

And then, using as a mask a prescribed resist pattern having a window on a region corresponding to the element isolation region formed on the silicon nitride film 108 by photolithography, the silicon nitride film 108 and oxide film 107 are removed by dry etching. For the dry etching, a mixed gas of Freon (CFC) gas and bromine (Br) gas is used. Subsequently, using SF$_6$ (sulfur hexafluoride) gas, the silicon trench 109a–109e are dry-etched in the N-type epitaxial layer 104, respectively. As shown in FIG. 6, the depth of the silicon trench 109a–109e is half as long as the film thickness of the N-type epitaxial layer 104, 0.3–0.5 μm in this embodiment.

Figure 7:
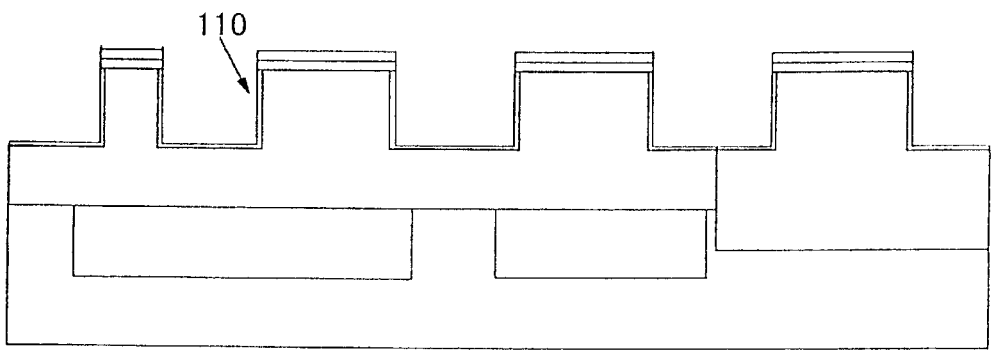
Figure 8:
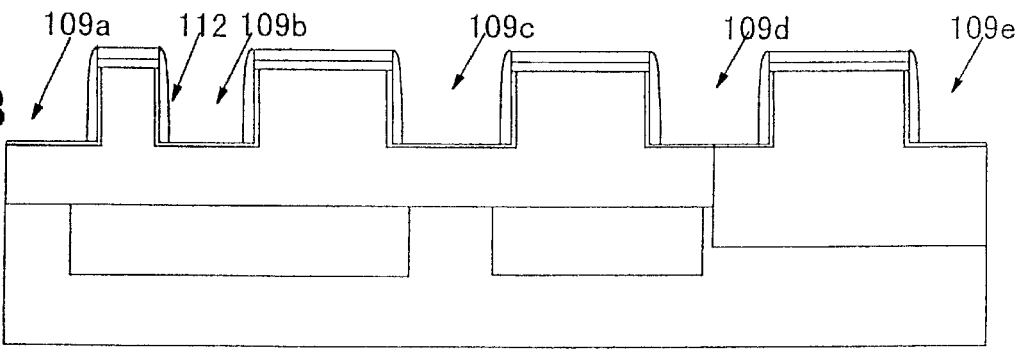

After the resist has been removed by oxygen plasma ashing, as shown in FIG. 7, the oxide film 110 are formed on the bottom and side of the silicon trench 109a–109e in an oxygen atmosphere at a temperature of about 1000° C. After the silicon nitride film having a thickness of about 40 nm is grown on the entire surface by reduced pressure CVD, the silicon nitride film is anisotropically etched using CFC gas to form the silicon nitride films 112 on the side of each the silicon trenches 109a–109e as shown in FIG. 8.

Figure 9:
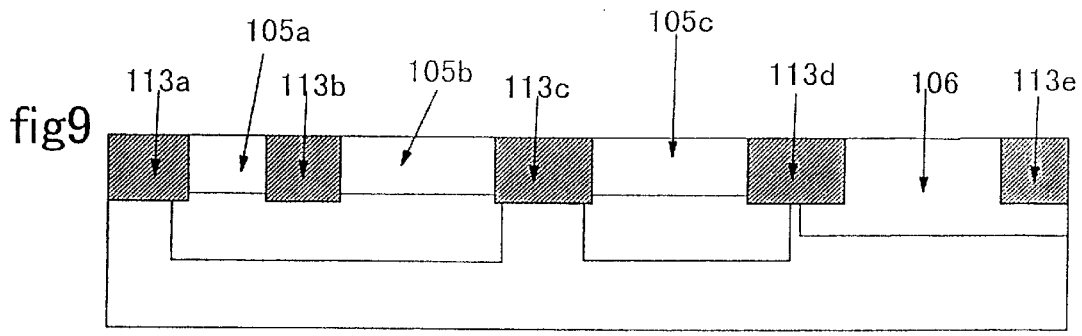

As shown in FIG. 9, oxidation is carried out at a temperature of about 1050° C. for 60 minutes to form the element isolation LOCOS film 113a–113e. Thereby element region is isolated to the N-type well layer 105a to 105c, and P-type well layer 106. These LOCOS films each has a thickness of 600–1000 nm.

Figure 10:
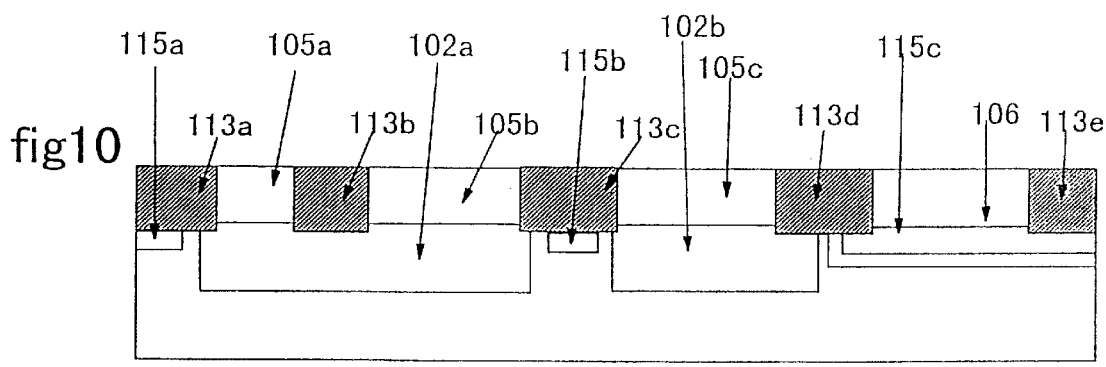

As shown in FIG. 10, after the silicon nitride film has been removed using phosphoric acid solution, by photolithography, windows of resist are made on prescribed regions for element isolation of the bipolar transistor and for the N-channel MOS transistor to be formed. Using as a mask the resist pattern thus made, monovalent boron ions are implanted with an acceleration energy of 160–300 keV and dosage of about $3 \times 10^{12}$ cm$^{-2}$. Thus, the channel stopper region 115a, 115b for element isolation of the bipolar transistor is formed which abuts on the bottom of the LOCOS film 113a, 113c for element isolation in the P-type Si substrate 101. The anti-punch-through layer 115c for the N-channel MOS transistor is also formed in the P-type well layer 106. In this case, the channel stopper region 115a, 115b are disposed with an interval so as to reach the N-type embedded collector layer 102a, as a condition of acceleration energy for ion implantation, a depth of implantation Rp is set which is approximately equal or slightly larger than the thickness of the element isolation LOCOS film.

Provision of the channel stopper layer 115a, 115b permits the element isolation withstand voltage of the bipolar transistor to be improved. Further, by providing the channel stopper layer 115a, 115b through the element isolation LOCOS film which is a feature of this embodiment of the present invention, a sufficient element isolation withstand voltage can be assured while avoiding an increase in the collector-substrate capacitance of the NPN transistor which is based on the junction formed with the N-type embedded collector layer 102a due to the transverse diffusion of the channel stopper layer when the heat treatment is carried out at a temperature of 1050–1150° C. to grow the N-type channel epitaxial layer 104 and form the N-type well layer 105, P-type well 106 and element isolation LOCOS films 113a–113e. Further, in the same step, by forming the anti-punch-through layer 115c of the N-channel type MOS transistor, without increasing the number of steps, the drain-source withstand voltage of the N-channel type MOS transistor and the short channel durability can be improved.

In the transistor based on the design rule for the processing technique with a minimum dimension of 1.0 μm, the embedded collector layer has an area of 25 μm$^2$ and a peripheral length of about 20 μm. Where the embedded collector has a junction depth of about 1.0 μm, about half of the collector-substrate junction capacitance is occupied by the peripheral portion. Therefore, in the transistor according to the present invention, the collector-substrate capacitance can be reduced to about half as compared with the embedded channel stopper according to the present invention.

Figure 11:
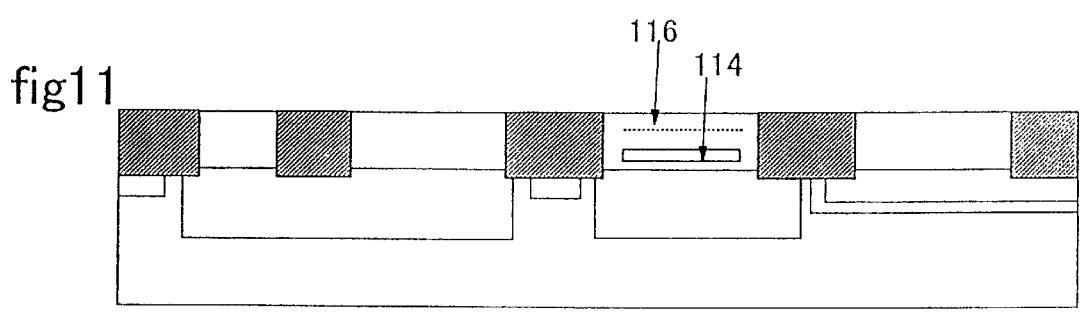

As shown in FIG. 11, after the resist has been removed by oxygen plasma ashing, by photolithography, a window of resist is made on a prescribed region where the P-channel MOS transistor is to be formed. Using as a mask the resist pattern thus made, boron (B) ions are implanted with dosage of about $4 \times 10^{12}$ cm$^{-2}$ and acceleration energy of 20 keV. Thus, an impurity layer 116 is formed for controlling the threshold voltage of the P-channel MOS transistor. Using as a mask the same resist pattern, phosphorus ions are implanted with dosage of $3 \times 10^{12} \text{cm}^{-2}$ and acceleration energy of 180 kev to form the anti-punch-through layer 114 of the P-channel MOS transistor. By provision of the anti-punch-through layer 114, the drain-source withstand voltage of the P-channel type MOS transistor and the short channel durability can be improved.

Figure 12:
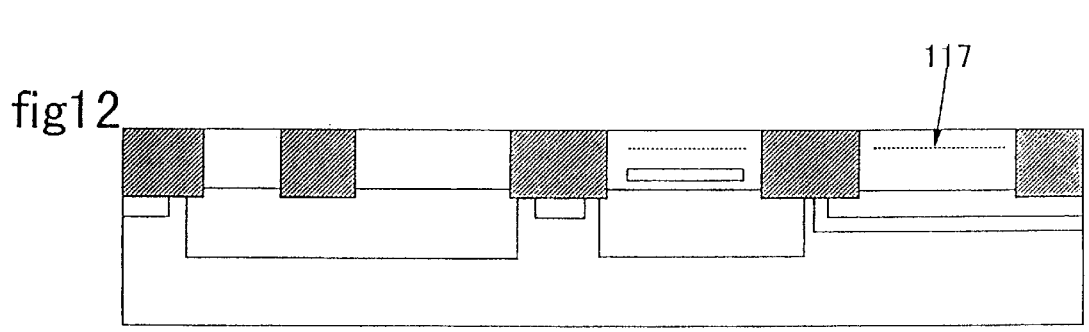

As shown in FIG. 12, after the resist has been removed by oxygen plasma ashing, by photolithography, a window of resist is made on a prescribed region where the N-channel MOS transistor is to be formed. Using as a mask the resist pattern thus made, boron (B) ions are implanted with dosage of $3 \times 10^{12} \text{cm}^{-2}$ and acceleration energy of 40 keV. The impurity layer 117 thus formed serves to control the threshold voltage of the N-channel MOS transistor. Because of the ion implantation for control of the threshold voltage, the threshold voltage of the P-channel MOS transistor is −0.5 to −0.8 V, and that of the N-channel MOS transistor is 0.5–0.8 V.

Figure 13:
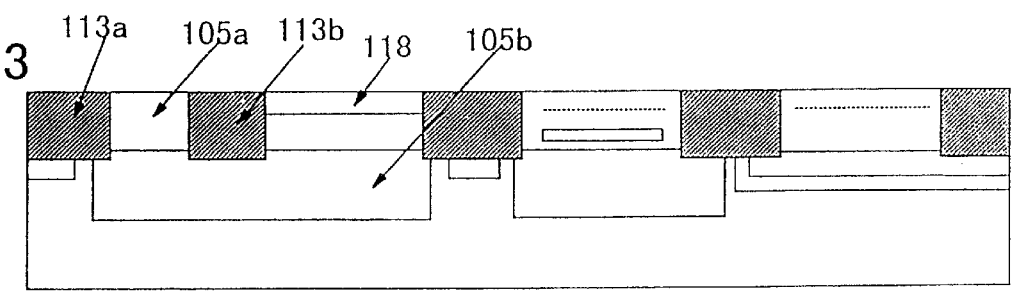

As shown in FIG. 13, after the resist has been removed by oxygen plasma ashing, using as a mask a resist pattern formed on the surface of the collector well layer 105b by photolithography, boron (B) ions are selectively implanted with dosage of $3 \times 10^{13} \text{cm}^{-2}$ and acceleration energy of 10–20 keV to form the base layer 118 of the NPN transistor.

Figure 14:
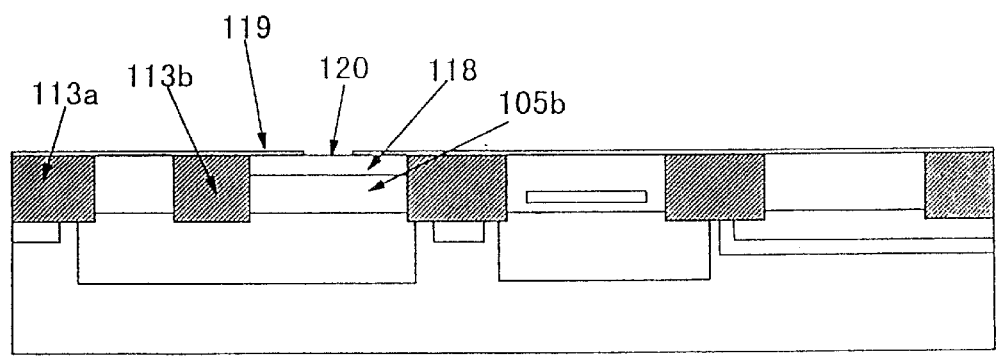

As shown in FIG. 14, after the resist has been removed by oxygen plasma ashing, the entire surface of the N-type epitaxial layer 104 is subjected to oxidation at a temperature of about 900° C. for 30 minutes to form gate oxide films 119a, 119b and 119c each having a thickness of about 10 nm. Using as a mask a prescribed resist pattern formed by photolithography, the gate oxide film of the emitter region of the NPN bipolar transistor is selectively etched using a mixed solution of ammonium fluoride and hydrofluoric acid to form an opening 120 for extending the emitter electrode.

After the resist has been removed by oxygen plasma ashing, by reduced pressure CVD using silane gas, a polycrystalline Si film having a thickness of about 300 nm for making an electrode of each element is formed on the entire surface of the epitaxial layer 104. Thereafter, using as a mask a prescribed resist pattern of the NPN bipolar transistor, arsenic (As) ions are implanted with dosage of $5 \times 10^{15} \text{cm}^{-2} - 1 \times 10^{16} \text{cm}^{-2}$ and acceleration energy of about 60 keV. Thereafter, the resist is removed by oxygen plasma ashing. Using as a mask a prescribed resist pattern for the MOS transistor, phosphorus ions are implanted with dosage of $1.5 \times 10^{15} \text{cm}^{-2} - 3 \times 10^{16} \text{cm}^{-2}$ and acceleration energy of about 40 keV.

Figure 15:
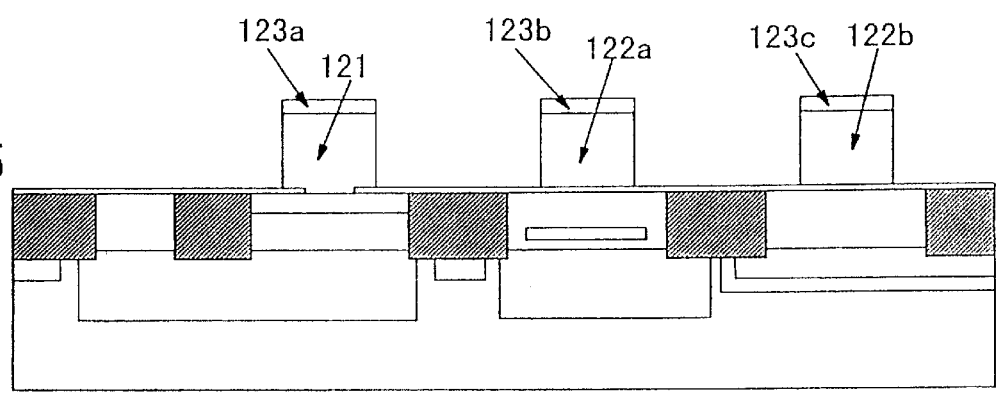

After the resist has been removed by oxygen plasma ashing, by reduced pressure CVD at a temperature of 700° C. using a mixed gas of TEOS and oxygen, an oxide film having a thickness of about 120–250 nm is formed on the entire surface of the polycrystalline Si film. Thereafter, as shown in FIG. 15, using as a mask a prescribed pattern, the oxide film thus formed is dry-etched using a mixed gas of $CHF_3$, ammonia and oxygen. The above polycrystalline Si film is anisotropically etched using a mixed gas of $SF_6$ and $C_2ClF_5$ to form the emitter electrode 121 providing a sheet resistance of 100–200 Ω/□ to the NPN bipolar transistor and to form the gate electrodes 122a and 122b providing a sheet resistance of 20–40 Ω/□ to the P-channel MOS transistor and N-channel MOS transistor. An oxide film 123a–123c each having a thickness of 120–250 nm is formed on each electrode.

Figure 16:
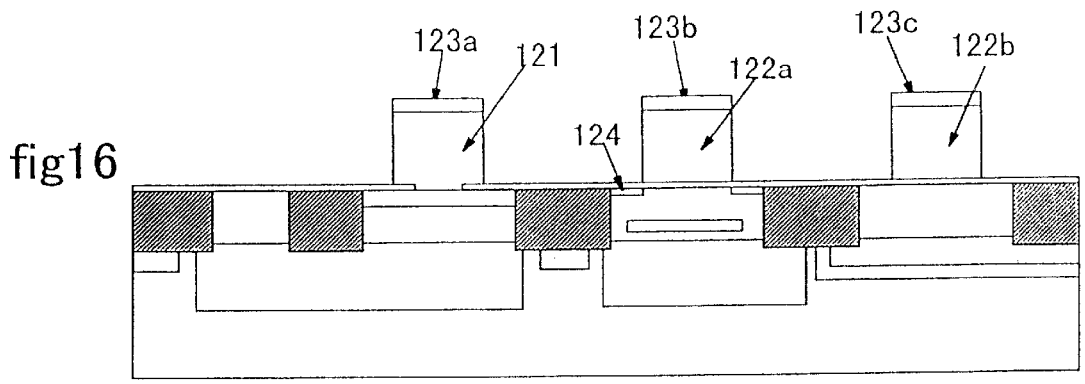

As shown in FIG. 16, after the resist pattern is removed by oxygen plasma ashing, using as a mask a resist pattern formed by photography and the gate electrode 122a of the P-channel MOS and oxide film 123b of the gate electrode, boron ions are implanted with dosage of about $5 \times 10^{12} \text{cm}^{-2}$ and acceleration energy of about 20 keV to form the LDD layer 124 of the P-channel MOS transistor in a self-aligned manner with the gate electrode. The LDD layer 124 has a junction depth of about 0.2 μm and a surface concentration of $1 \times 10^{18} \text{cm}^{-3}$. Thereafter, the resist is removed by oxygen plasma ashing.

Figure 17:
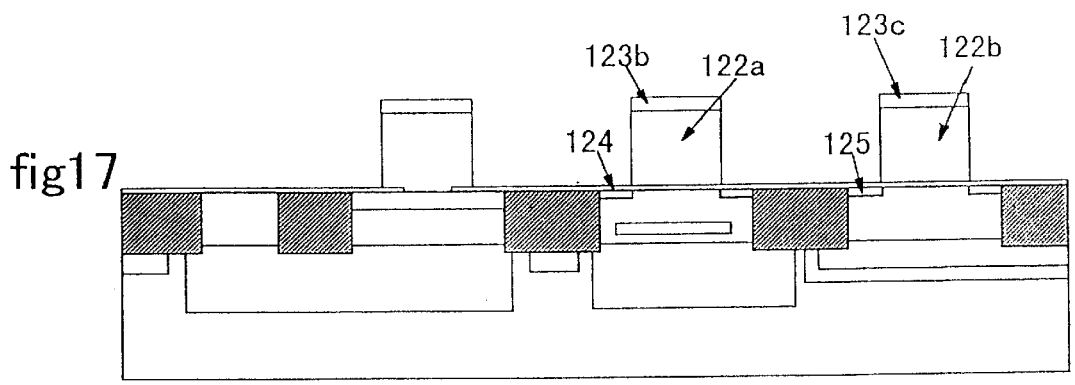

As shown in FIG. 17, using as a mask a resist pattern formed by photography and the gate electrode 122b of the N-channel MOS transistor and oxide film 123c of the gate electrode, phosphorus ions are implanted with dosage of about $1 \times 10^{13} \text{cm}^{-2}$ and acceleration energy of about 40 keV to form the LDD layer 125 of the N-channel MOS transistor in-a self-aligned manner with the gate electrode. The LDD layer 125 has a junction depth of about 0.2 m and a surface concentration of $1 \times 10^{18} \text{cm}^3$. Thereafter, the resist is removed by oxygen plasma ashing.

By reduced pressure CVD using a mixed gas of TEOS and oxygen, an oxide film having a thickness of about 150 nm is formed on entire surface for making an insulating film of each electrode side wall.

Figure 18:
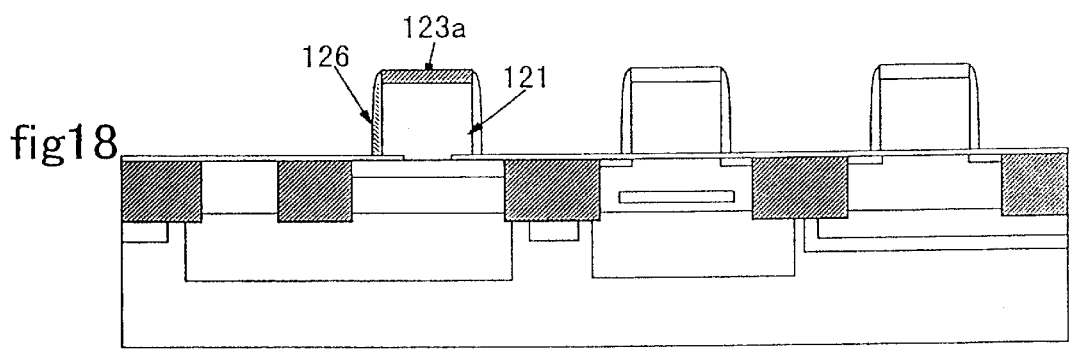

As shown in FIG. 18, the above oxide film thus formed is anisotropically etched using a mixed gas of $CHF_3$, oxygen and helium to form the side wall oxide film 126 of the emitter electrode of the NPN bipolar transistor, side wall oxide film 126 of the first gate electrode of the P-channel MOS transistor and side wall oxide film 126 of the gate electrode of the N-channel MOS transistor.

Figure 19:
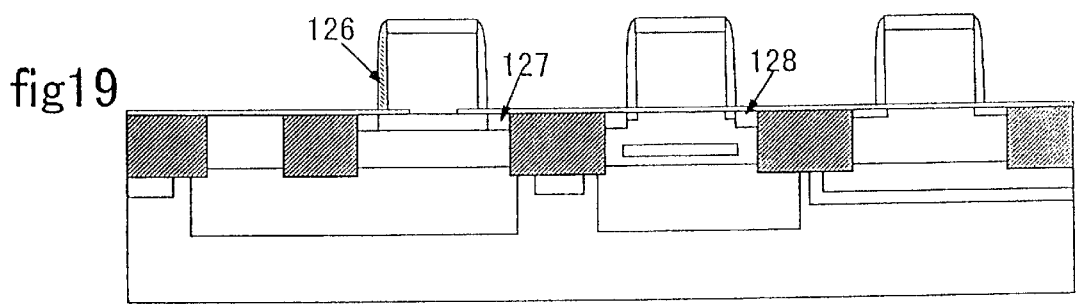

As shown in FIG. 19, using as a mask a resist pattern formed by photolithography and the side wall oxide film 126 of the emitter electrode of the NPN transistor, the oxide film 123b and side wall oxide film 126 of the gate electrode of the P-channel MOS transistor, boron ions are implanted with dosage of about $5 \times 10^{15} \text{cm}^{-2}$ and acceleration energy of about 10 keV to form the external base layer 127 of the NPN transistor and source-drain layer 128 of the P-channel MOS transistor in a self-aligned manner with the oxide film side wall of each electrode. The external 127 and source-drain layer 128 each has a junction depth of about 0.2 μm and a surface concentration of $1 \times 10^{20} \text{cm}^{-3}$.

Figure 20:
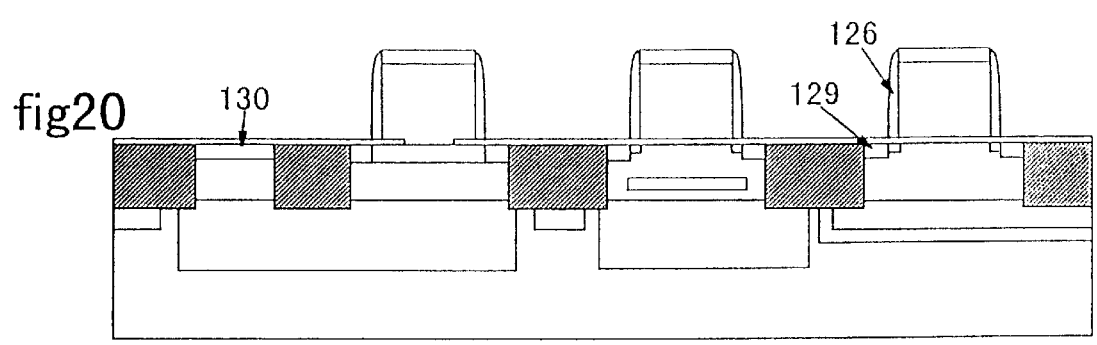
Figure 21:
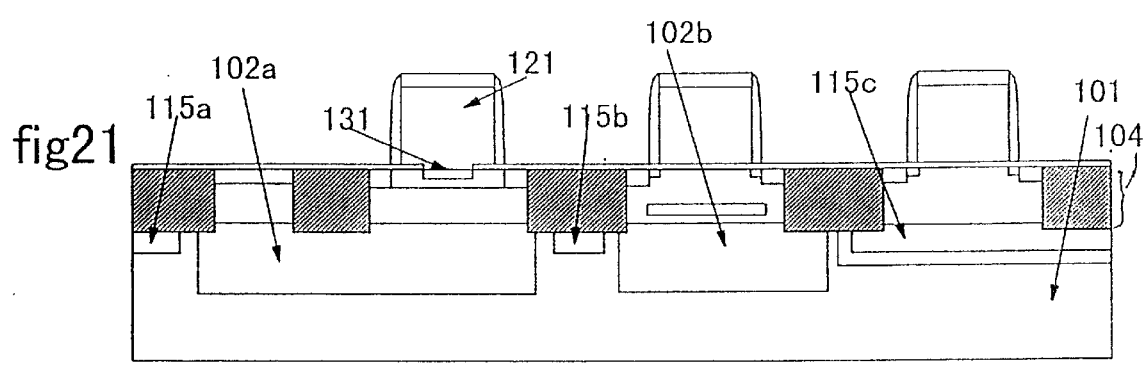

As shown in FIG. 20, after the resist has been removed by oxygen plasma ashing, using as a mask a resist pattern formed by photolithography, the oxide film 123c and the oxide film side wall 126 of the gate electrode of the N-channel MOS transistor, arsenic (As) ions are implanted with dosage of about $5 \times 10^{15} \text{cm}^{-2}$ and acceleration energy of about 40 kev to form the collector contact layer 130 of the NPN transistor and also to form the source-drain layer 129 of the N-channel MOS transistor in a self-aligned manner with the oxide film side wall of each electrode. The source-drain layer 129 and collector contact layer 130 each has a junction depth of about 0.1 μm and a surface concentration of $1 \times 10^{20} \text{cm}^{-3}$.

As shown in FIG. 21, after the resist has been removed by oxygen plasma ashing, heat treatment is carried out in an atmosphere of nitrogen at a temperature of 900° C. for about 30 minutes so that arsenic (As) in the emitter electrode 121 of the NPN bipolar transistor is diffused into the base layer 118 through the opening 120 for extending the emitter electrode thereby to form the emitter layer 131. The emitter layer 131 has a junction depth of about 0.05 μm and a surface concentration of $3 \times 10^{20} \text{cm}^{-3}$.

In accordance with the first embodiment of the present invention, by making windows of resist by photolithography in prescribed regions on the element isolation LOCOS films 113a and 113c and P-type well layer 106 and, using as a mask the resist pattern thus made by diffusing impurities to form the channel stopper region 115a, 115b for element isolation and anti-punch-through layer 115c for the N-channel MOS transistor, a sufficient element isolation withstand voltage can be assured while avoiding an increase in the collector-substrate capacitance of the NPN transistor which is based on the junction formed with the N-type embedded collector layer 102a due to the transverse diffusion of the channel stopper layer when the heat treatment is carried out at a temperature of 1050–1150° C. to grow the N-type channel epitaxial layer 104 and form the N-type well layer 105, P-type well 106 and element isolation LOCOS films 113a–113e. Further, in the same step, by forming the anti-punch-through layer 115c of the N-channel type MOS transistor, without increasing the number of steps, the drain-source withstand voltage of the N-channel type MOS transistor and the short channel durability can be improved.

Now referring to sectional views in a step sequence of FIGS. 22–27, an explanation will be given of the second embodiment of the present invention.

Figure 27:
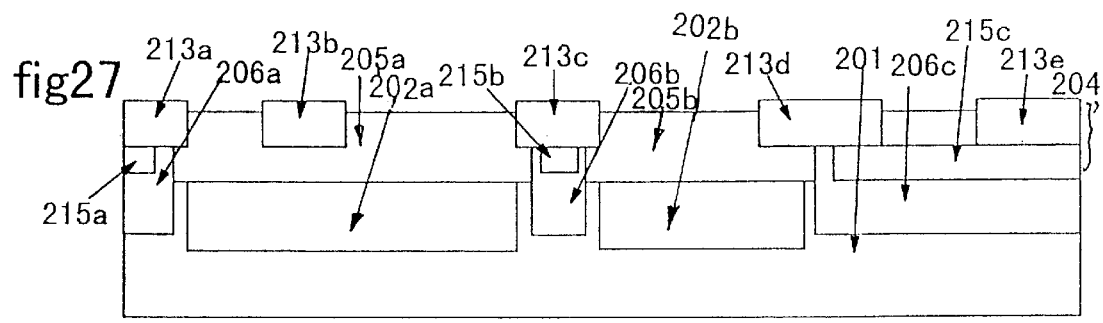
Figure 32:
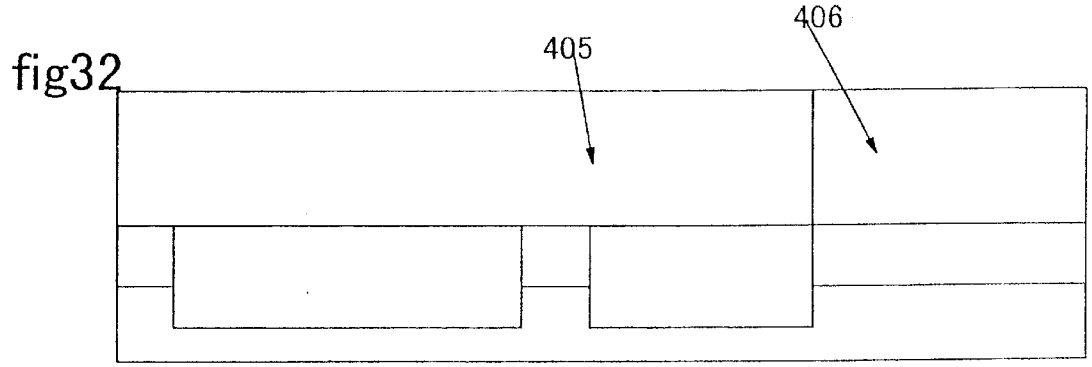
Figure 33:
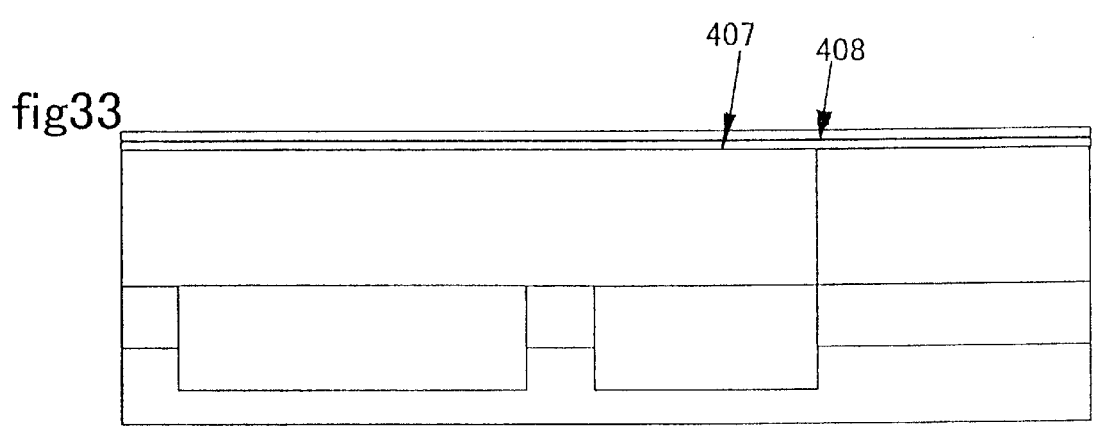
Figure 34:
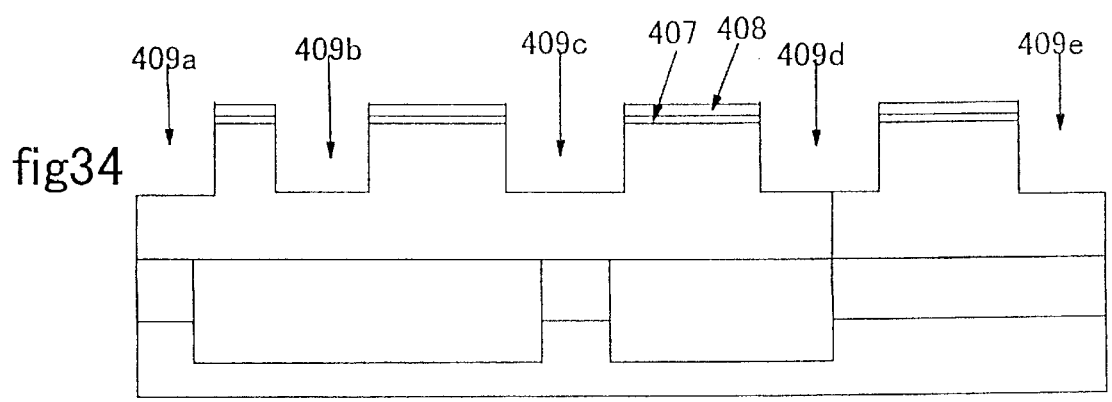
Figure 37:
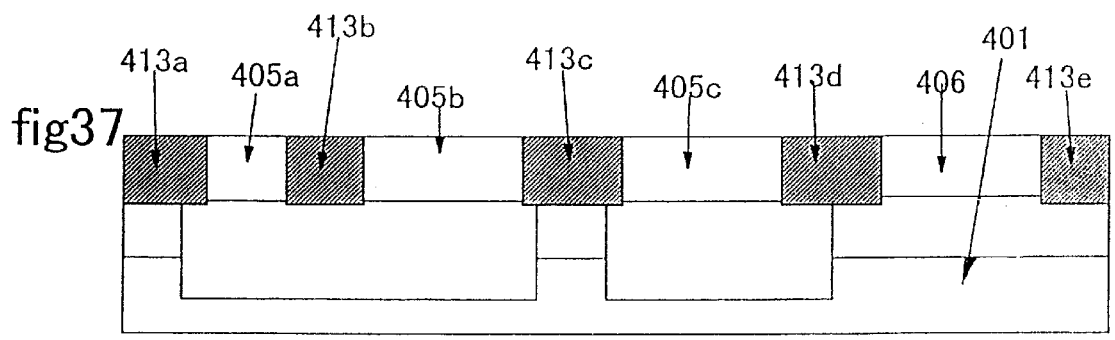
Figure 38:
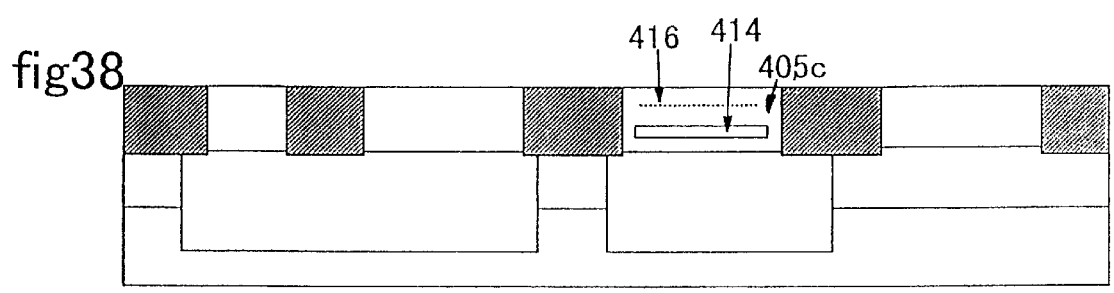
Figure 39:
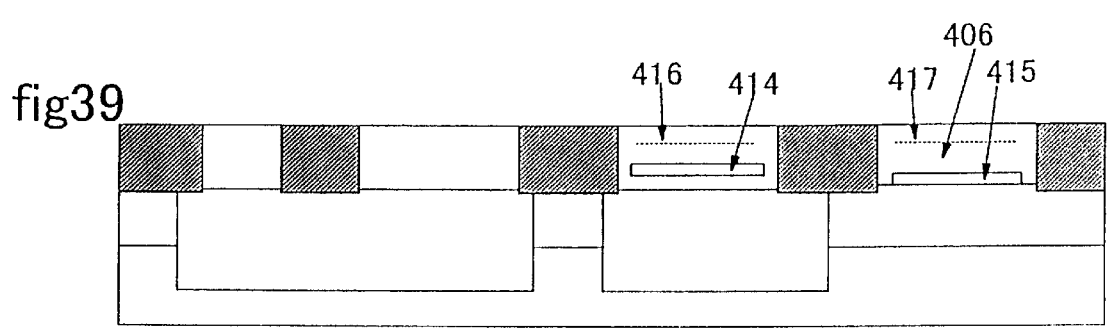
Figure 40:
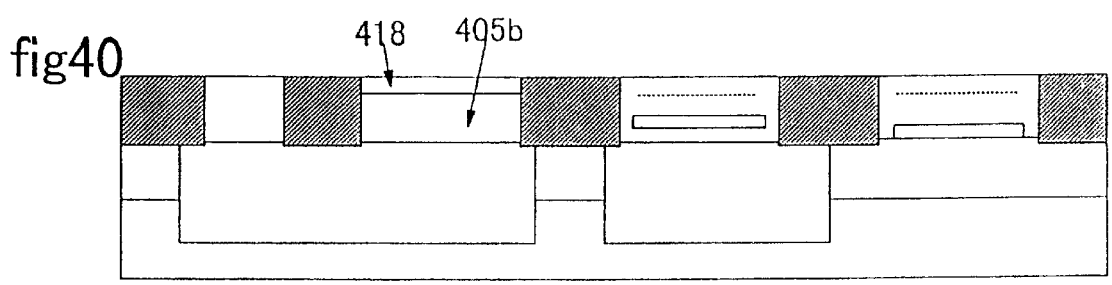
Figure 41:
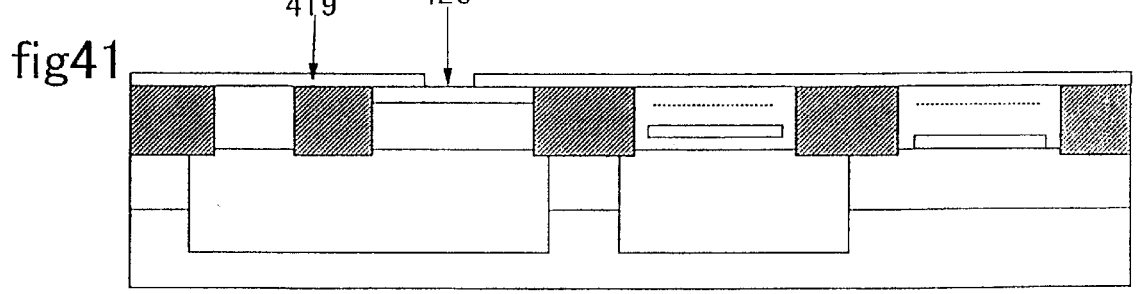
Figure 42:
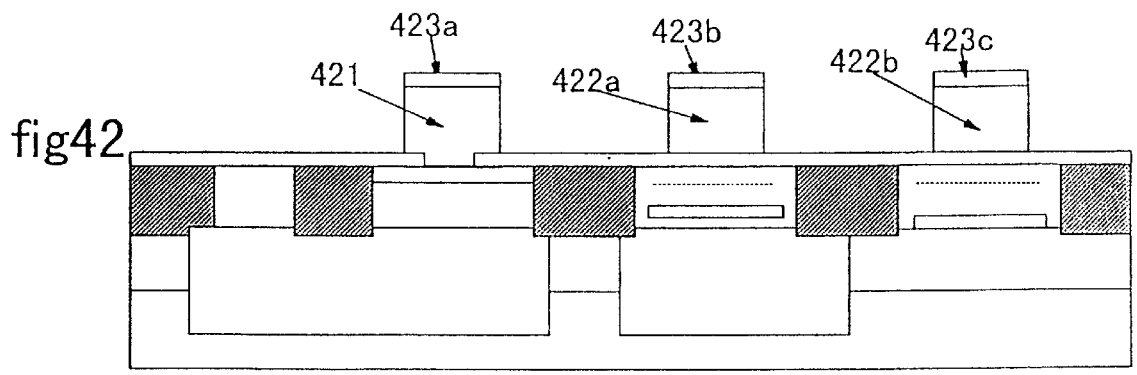
Figure 43:
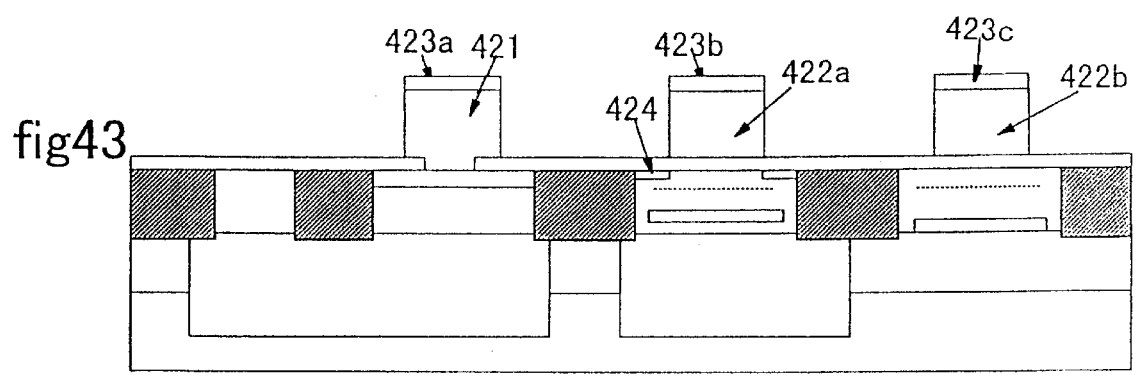
Figure 44:
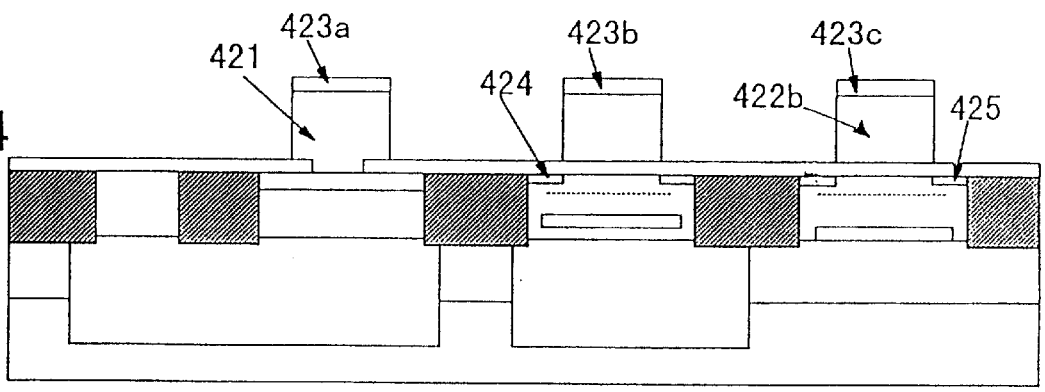
Figure 45:
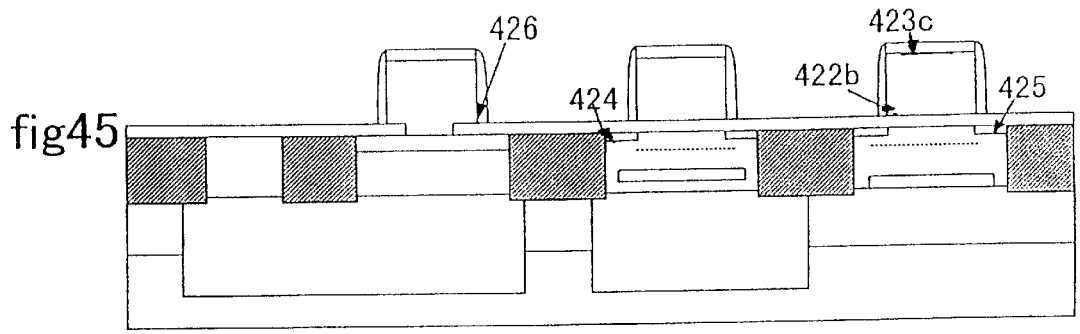
Figure 46:
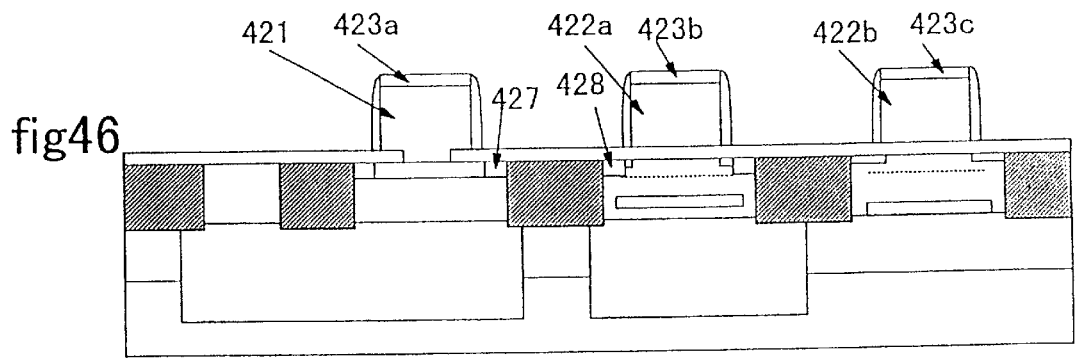
Figure 47:
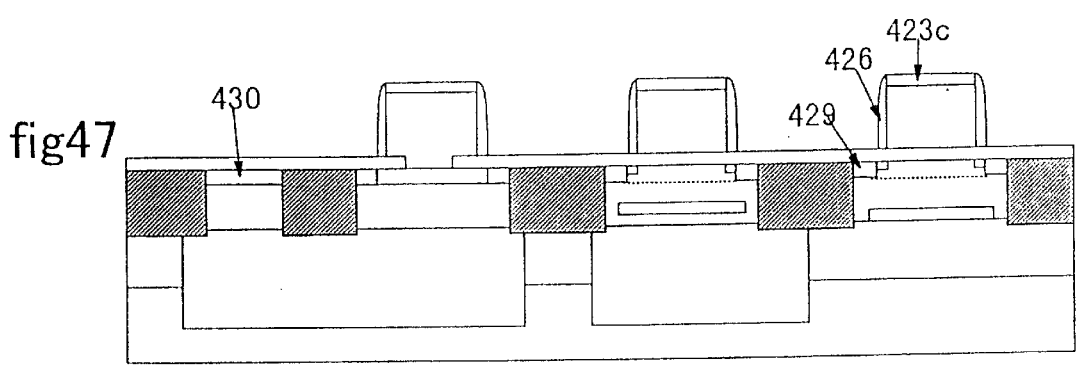
Figure 48:
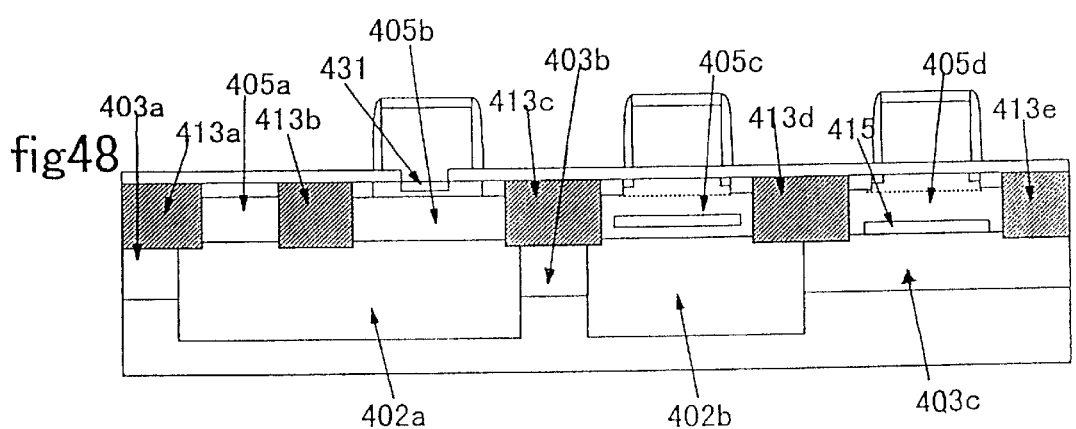

The method characterized in that by ion implantation through the thin element isolation film formed on the low concentrated element isolation diffusion layer, channel stopper layer is formed under the thin element isolation film. Namely as shown in FIG. 27, N-type embedded collector layer 202a of an NPN bipolar transistor and a N-type embedded well layer 202b of a P-channel MOS transistor are formed on the P-type Si substrate 201, then an epitaxial layer 204 is formed on the entire surface of the P-type Si substrate 201. And then a P-type element isolation diffusion layer 205a, 205b having a low concentration which serves as element isolation, which is formed so as to reach the P-type Si substrate 201 from the top of the N-type epitaxial layer 204, a P-type well layer 206c constituting a well layer of an N-channel MOS transistor, which is formed to reach the P-type Si substrate 201 from the top of the N-type epitaxial layer 204, thin element isolation film 213a–213e are formed and then by ion implantation through the element isolation film 213–213e, channel stopper layer 215a–215c.

First, like same as the first embodiment as shown in FIG. 1 using as a mask a resist pattern having windows made by photolithography on regions where an NPN bipolar transistor and P-channel MOS transistor are to be formed, into the surface of a P-type Si substrate 201 having a resistivity of 10 Ω·cm and plane orientation of (100) doped with boron (B), ions of arsenic (As) or antimony (Sb) are implanted from the surface of the P-type Si substrate 101. The ion implantation is carried out with dosage of ion implantation is about $1\times10^{15}cm^{-2}$ and acceleration energy of 40–60 keV.

As shown in FIG. 21, after the resist has been removed by oxygen plasma ashing, heat treatment is carried out for 15–30 minutes at a temperature range of 1150–1200° C. to form an N-type embedded layer 102a and N-type well layer 102b having a junction depth of 1–2 μm and sheet resistance of 50–150 Ω/□.

As shown in FIG. 22, on the surface of the P-type Si semiconductor substrate 201, an N-type epitaxial layer 104 is formed which has a thickness of 0.6–1.0 μm and resistivity of 1–5 Ω·cm due to impurities of As or P (phosphorus). The N-type epitaxial layer 104 is formed at a temperature of 1050° C. and pressure of about 80×133.322 Pa using a mixed gas of dichloro silane and arsine.

Like same as the first embodiment as shown in FIG. 3, using as a mask the resist pattern formed on the surface of the N-type epitaxial layer 204 and having windows made by photolithography on regions where the NPN bipolar transistor and P-channel MOS transistor are to be formed, ions of P (phosphorus) are implanted from the surface of the N-type epitaxial layer 204. The ion-implantation is carried out with dosage of $1\times10^{13}cm^{-2}$ and acceleration of 100 keV.

After the resist has been removed by oxygen plasma ashing, as shown in FIG. 23, a window of resist is made by photolithography in an element isolation region of the bipolar transistor and the region where the N-channel MOS transistor is to be formed. Using as a mask the resist pattern thus made, boron (B) is ion-implanted. In this case, the ion-implantation is carried out by dosage of $1\times10^{13}$–$2\times10^{13}cm^{-2}$ and acceleration energy of about 20 keV.

Then the resist is removed by oxygen plasma ashing, heat treatment is carried out in an atmosphere of nitrogen gas at a temperature of 1100° C. for 90–150 minutes. Thus, as shown in FIG. 24 the N-type well layer 205, having a depth of the diffused layer of 0.6–1.0 μm and a surface concentration of about $5\times10^{16}cm^{-3}$, is formed which reach the N-type embedded collector layer 202a of the NPN bipolar transistor and the N-type embedded well layer 202b of the P-channel MOS transistor. Further, at the same the P-type isolation layer 206a, 206b of the bipolar transistor and the P-type isolation layer 206c of the N-channel MOS transistor, having a depth of the diffused layer of 0.8–1.5 μm and a surface concentration of about $7\times10^{16}cm^{-3}$, are formed which reach the P-type Si substrate 201. Thereby the N-type well layer 205 is divided into the N-type collector well layer 205a of the NPN bipolar transistor and the N-type well 205b, 206b.

After the oxide film 207 is formed by thermal oxidation in an oxygen atmosphere at a temperature of 1000° C. on the surface of the N-type epitaxial layer 204, a silicon nitride film 208 is formed which is used as a selective mask when the LOCOS film is created. The silicon nitride film 208 having a thickness of about 120 nm is formed by reduced pressure CVD using a mixed gas of dichloro silane and ammonia.

Figure 26:
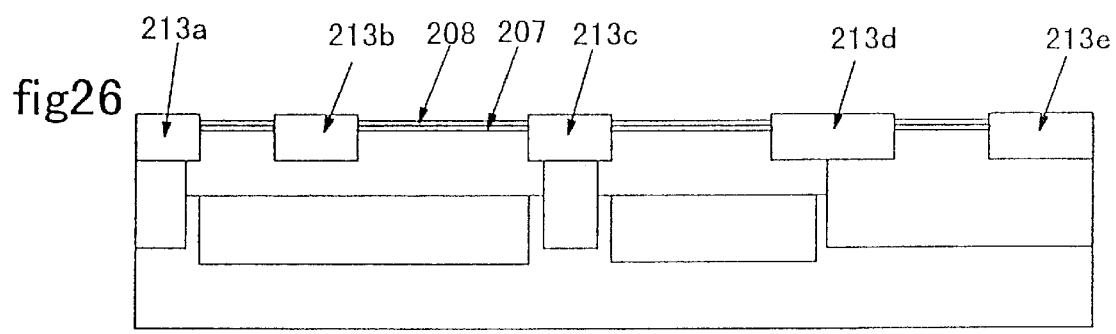

As shown in FIG. 25, using as a mask a prescribed resist pattern corresponding to the element isolation region formed on the silicon nitride film 208 by photolithography, the silicon nitride film is removed by dry etching. For the dry etching, a mixed gas of CFC gas and bromine (Br) gas is used. Subsequently, as shown in FIG. 26, after the resist has been removed by oxygen plasma ashing, oxidation is carried out at a temperature of about 1050° C. for about 60 minutes to form the field LOCOS films 213a–213e. The film thickness of each LOCOS film is 400–800 nm.

As shown in FIG. 27, after the silicon nitride film 208 and the oxide film 207 have been removed using phosphoric acid solution and a mixed solution of ammonium fluoride ($NH_4F$) and hydrofluoric acid (HF) respectively, by photolithography, windows of resist are made on prescribed regions for element isolation of the bipolar transistor and for the N-channel MOS transistor to be formed. Using as a mask the resist pattern thus made, monovalent boron ions are implanted with acceleration energy of 150–250 keV and dosage of about $3\times10^{12}cm^{-2}cm^{-2}$. Thus, the channel stopper region 215a, 215b for element isolation of the bipolar transistor is formed which abuts on the bottom of the LOS film 213a, 213c for element isolation in the P-type element isolation layer 206a, 206b. The anti-punch-through layer 215c for the N-channel MOS transistor is also formed in the P-type well layer 206c. In this case, as a condition of acceleration energy for ion implantation, Rp is set which is approximately equal or slightly larger than the thickness of the element isolation LOCOS film.

In this way, where the element isolation film 213a, 213c is oxidized on the P-type element isolation layer having a low concentration, impurities constituting the P-type element isolation layer, now, those of boron are taken into the oxide film of the field LOCOS film so that the impurity concentration of the P-type element isolation layer 206a, 206b immediately below the field LOCOS film 213a, 213c is reduced. The reduction in the impurity concentration will form a depletion layer or inverted layer immediately below the field LOCOS field, thus dropping the element isolation withstand voltage. In order to avoid such an inconvenience, the channel stopper layer 215a, 215b is required immediately below the field LOCOS film.

Thereafter, through the same step as in the first embodiment, in the second embodiment also are formed the bipolar transistor, P-channel MOS transistor, N-channel MOS transistor and each element isolation region.

In accordance with the second embodiment of the present invention, by making windows of resist by photolithography in prescribed regions on the field LOCOS films 213a and 213c and P-type well layer 206 and, using as a mask the resist pattern thus made by diffusing impurities to form the channel stopper region 215a, 215b for element isolation and anti-punch-through layer 215c for the N-channel MOS transistor, a sufficient element isolation withstand voltage can be assured while avoiding an increase in the collector-substrate capacitance of the NPN transistor which is due to the transverse diffusion of the channel stopper layer when the heat treatment is carried out at a temperature of 1050–1150° C. to grow the N-type channel epitaxial layer 204 and form the N-type well layer 205a, 205b, P-type well 206a, 206b and field LOCOS films 213a–213e. Further, in the same step, by forming the anti-punch-through layer 215c of the N-channel type MOS transistor, without increasing the number of steps, the drain-source withstand voltage of the N-channel type MOS transistor and the short channel durability can be improved.

Additionally, in the inventions described above, when the channel stopper layer for isolation of the bipolar transistor and anti-punch-through layer 115a–115c and 215a–215c are formed, monovalent boron is ion-implanted. But, divalent or trivalent boron may be ion-implanted. In this case, if diffusion depth Rp is constant, the acceleration energy can be decreased.

As described hitherto, the present invention comprises steps of forming a mask film having windows on an element isolation insulating film and a first impurity diffused layer which reaches a semiconductor substrate from the surface of a semiconductor layer the semiconductor substrate in a region where an element is to be formed; and simultaneously introducing impurities into the semiconductor substrate in an element isolation region and the first impurity diffused layer through the windows of the mask film by ion implantation to form a second impurity diffused layer which abuts on the bottom of the element isolation film and a third impurity diffused layer in said first impurity diffused layer. Thus, an excellent method of fabricating a semiconductor integrated circuit device can be provided which realize a high element withstand voltage and low parasitic capacitance.

What is claimed is:

1. A method of fabricating a semiconductor integrated circuit device comprising the steps of:

on a semiconductor substrate having a first conductivity type, forming a semiconductor layer having a second conductivity type opposite to the conductivity type of the semiconductor substrate;

forming an element isolation insulating film to reach said semiconductor substrate; and introducing impurities of the first conductivity type into said semiconductor substrate through the element isolation insulating film by ion implantation to form an impurity diffused layer having the first conductivity type which abuts on a bottom of said element isolation insulating film.

2. The method of fabricating a semiconductor integrated circuit device according to claim 1, wherein the introducing step comprises the steps of:

forming a mask film having a prescribed window on said element isolation insulating film; and introducing impurities of the first conductivity type into said semiconductor substrate through the window of said mask by ion implantation to form the impurity diffused layer having the first conductivity type which abuts on the bottom of said element isolation insulating film.

3. A method of fabricating a semiconductor integrated circuit device comprising the steps of:

on a semiconductor substrate having a first conductivity type, forming a semiconductor layer having a second conductivity type opposite to the conductivity type of the semiconductor substrate;

forming an element isolation diffused layer having the first conductivity type to reach the semiconductor substrate;

forming an isolation insulating film on the surface of the element isolation diffused layer; and introducing impurities having the first conductivity type into said element isolation diffused layer through the insulating film by ion implantation to form an impurity diffused layer as a channel stopper, having the first conductivity type which abuts on a bottom of said isolation insulating film.

4. The method of fabricating a semiconductor integrated circuit device according to claim 3, wherein the introducing step comprises the steps of:

forming a mask film having a prescribed window on said isolation insulating film; and introducing impurities having the first conductivity type into said element isolation diffused layer through the window of said mask by ion implantation to form the impurity diffused layer having the first conductivity type which abuts on the bottom of said isolation insulating film.

5. A method of fabricating a semiconductor integrated circuit device, comprising the steps of:

on a semiconductor substrate having a first conductivity type, forming a semiconductor layer having a second conductivity type opposite to the conductivity type of the semiconductor substrate;

forming a first impurity diffused layer having the first conductivity type on the semiconductor layer corresponding to a region where an element is to be formed so as to reach the semiconductor substrate;

forming an element isolation insulating film from a surface of the semiconductor layer;

introducing impurities of the first conductivity type into said semiconductor substrate through the element isolation insulating film and into the first impurity diffused layer corresponding to the region where the element is to be formed by ion implantation to form a second impurity diffused layer having the first conductivity types which abuts on a bottom of said element isolation insulating film, and a third impurity diffused layer having the first conductivity type in the first diffused layer.

6. The method of fabricating a semiconductor integrated circuit device according to claim 5, wherein the introducing step comprises the steps of:

forming a mask film having prescribed windows on said element isolation insulating film and on said semiconductor layer corresponding to the region where the element is to be formed; and simultaneously introducing impurities having the first conductivity type into said semiconductor substrate corresponding to the element isolation region and the first impurity diffused layer through the windows of the mask by ion implantation to form the second impurity diffused layer having the first conductivity types, which abuts on the bottom of said element isolation insulating film, and the third impurity diffused layer having the first conductivity type in said first impurity diffused layer.

7. A method of fabricating a semiconductor integrated circuit device comprising the steps of:

on a semiconductor substrate having a first conductivity type, forming a semiconductor layer having a second conductivity type opposite to the conductivity type of the semiconductor substrate;

forming a first impurity diffused layer having the first conductivity type;

forming an element isolation diffused layer having the first conductivity type to reach the semiconductor substrate;

forming an insulating film on the surface of the element isolation diffused layer; and simultaneously introducing impurities having the first conductivity type into said element isolation diffused layer and said first impurity diffused layer by ion implantation to form a second impurity diffused layer having the first conductivity type which abuts on a bottom of said isolation insulating film, and a third impurity diffused layer having the first conductivity type in said first impurity diffused layer.

8. The method of fabricating a semiconductor integrated circuit device according to claim 7, wherein the introducing step comprises the steps of:

forming a mask film having prescribed windows on said isolation insulating film and on said semiconductor layer corresponding to the said region where an element is to be formed; and simultaneously introducing impurities having the first conductivity type into said element isolation diffused layer and said first impurity diffused layer through the windows of said mask by ion implantation to form a second impurity diffused layer having the first conductivity type which abuts on a bottom of said isolation insulating film, and a third impurity diffused layer having the first conductivity type in said first impurity diffused layer.

9. The method of fabricating a semiconductor device according to claim 1, wherein the step of forming said element isolation insulating film comprises a thermal oxidation step.

10. A method of fabricating a semiconductor device according to claim 3, wherein the step of forming said insulating film comprises a thermal oxidation step.

11. The method of fabricating a semiconductor device according to claim 5, wherein the step of forming said element isolation insulating film comprises a thermal oxidation step.

12. The method of fabricating a semiconductor device according to claim 7, wherein the step of forming said insulating film comprises a thermal oxidation step.

13. A method of fabricating a semiconductor device according to claim 3, wherein the step of forming said isolation insulating film comprises a thermal oxidation step.

14. The method of fabricating a semiconductor device according to claim 7, wherein said first impurity diffused layer is a P-type well layer constituting an N-channel type MIS transistor on its surface, and the introducing step comprises an ion implantation for introducing impurities, wherein monovalent boron ions are implanted with an acceleration energy of 120 keV or more.

15. The method of fabricating a semiconductor device according to claim 7, wherein said first impurity diffused layer is a P-type well layer constituting an N-channel type MIS transistor on its surface, and the introducing step comprises an ion implantation for introducing impurities, wherein divalent boron ions are implanted with an acceleration energy of 60 keV or more.

16. The method of fabricating a semiconductor device according to claim 7, wherein said first impurity diffused layer is a P-type well layer constituting an N-channel type MIS transistor on its surface, and the introducing step comprises an ion implantation for introducing impurities, wherein trivalent boron ions are implanted with an acceleration energy of 40 keV or more.

* * * * *